US010482388B1

(12) United States Patent
Jock et al.

(10) Patent No.: US 10,482,388 B1
(45) Date of Patent: Nov. 19, 2019

(54) SPIN-ORBIT QUBIT USING QUANTUM DOTS

(71) Applicant: National Technology & Engineering Solutions of Sandia, LLC, Albuquerque, NM (US)

(72) Inventors: Ryan Michael Jock, Albuquerque, NM (US); Martin Rudolph, Albuquerque, NM (US); Andrew David Baczewski, Albuquerque, NM (US); Wayne Witzel, Albuquerque, NM (US); Malcom S. Carroll, Albuquerque, NM (US); Patrick Harvey-Collard, Magog (CA); John King Gamble, IV, Redmond, WA (US); Noah Tobias Jacobson, Albuquerque, NM (US); Andrew Mounce, Albuquerque, NM (US); Daniel Robert Ward, Albuquerque, NM (US)

(73) Assignee: National Technology & Engineering Solutions of Sandia, LLC, Alburquerque, NM (US)

( * ) Notice: Subject to any disclaimer, the term of this patent is extended or adjusted under 35 U.S.C. 154(b) by 0 days.

(21) Appl. No.: 16/023,211

(22) Filed: Jun. 29, 2018

(51) Int. Cl.
*H01L 39/00* (2006.01)
*G06N 10/00* (2019.01)
(Continued)

(52) U.S. Cl.
CPC .......... *G06N 10/00* (2019.01); *H01L 39/025* (2013.01); *H01L 39/12* (2013.01); *H01L 39/223* (2013.01); *B82Y 10/00* (2013.01)

(58) Field of Classification Search
CPC ..... H01L 39/025; H01L 39/12; H01L 39/223; H01L 39/225; H01L 39/18; H01L 39/24; B82Y 10/00; B82Y 40/00; G06N 10/00
See application file for complete search history.

(56) References Cited

U.S. PATENT DOCUMENTS

| 6,472,681 | B1 * | 10/2002 | Kane | ...... B82Y 10/00 257/14 |
| 6,597,010 | B2 * | 7/2003 | Eriksson | ...... B82Y 10/00 257/14 |

(Continued)

OTHER PUBLICATIONS

Tyryshkin, A. et al., "Electron spin coherence exceeding seconds in high-purity silicon", Nature Materials, 2012, pp. 143-147, vol. 11.

(Continued)

*Primary Examiner* — Nikolay K Yushin
(74) *Attorney, Agent, or Firm* — Martin I. Finston

(57) ABSTRACT

Methods and apparatus of quantum information processing using quantum dots are provided. Electrons from a 2DEG are confined to the quantum dots and subjected to a magnetic field having a component directed parallel to the interface. Due to interfacial asymmetries, there is created an effective magnetic field that perturbs the energies of the spin states via an interfacial spin-orbit (SO) interaction. This SO interaction is utilized to controllably produce rotations of the electronic spin state, such as X-rotations of the electronic spin state in a double quantum dot (DQD) singlet-triplet (ST) qubit. The desired state rotations are controlled solely by the use of electrical pulses.

8 Claims, 13 Drawing Sheets

(51) Int. Cl.
H01L 39/02 (2006.01)
H01L 39/22 (2006.01)
H01L 39/12 (2006.01)
B82Y 10/00 (2011.01)

(56) References Cited

U.S. PATENT DOCUMENTS

| | | | | |
|---|---|---|---|---|
| 7,781,754 | B2* | 8/2010 | Loss | G06N 10/00 257/9 |
| 9,530,873 | B1* | 12/2016 | Carroll | H01L 29/66977 |
| 2002/0179897 | A1* | 12/2002 | Eriksson | B82Y 10/00 257/14 |
| 2008/0142787 | A1* | 6/2008 | Loss | G06N 10/00 257/25 |
| 2017/0206461 | A1* | 7/2017 | Friesen | G06N 10/00 |

OTHER PUBLICATIONS

Veldhorst, M. et al., "An addressable quantum dot qubit with fault-tolerant control-fidelity" Nature Nanotechnology, 2014, pp. 981-985, vol. 9.
Veldhorst, M. et al., "A two-qubit logic gate in silicon", Nature, 2015, pp. 410-414, vol. 526.
Gamble, J.K. et al., "Valley splitting of single-electron Si MOS quantum dots", Applied Physics Letters, 2016, 252101, vol. 109.
Rochette, S. et al., "Single-electron-occupation metal-oxide-semiconductor quantum dots formed from efficient poly-silicon gate layout", Preprint at http://arxiv.org/abs/1707.03895, 2017.
Veldhorst, M. et al., "Spin-orbit coupling and operation of multi-valley spin qubits", Phys. Rev. B, 2015, 201401, vol. 92.
Jones, C. et al., A logical qubit in a linear array of semiconductor quantum dots, Preprint at http://arxiv.org/abs/1608.06335, 2016.
Ralls, K.S. et al., "Discrete Resistance Switching in Submicrometer Silicon Inversion Layers: Individual Interface Traps and Low-Frequency (1/f) Noise", Physical Review Letters, 1984, pp. 228-231, vol. 52.
Culcer, D. et al., "Dephasing of Si singlet-triplet qubits due to charge and spin defects", Appl. Phys. Lett., 2013, 232108, vol. 102.
Bermeister, A. et al., "Charge noise, spin-orbit coupling, and dephasing of single-spin qubits", Appl. Phys. Lett, 192102, 2014, vol. 105.
Kawakami, E. et al., "Electrical control of a long-lived spin qubit in a Si/SiGe quantum dot", Nature Nanotechnology, 2014, pp. 666-670, vol. 9.
Egn, K. et al., "Isotopically enhanced triple-quantum-dot qubit", Sci. Adv., 2015, e1500214, vol. 1.
Zajac, D. M. et al., "A reconfigurable gate architecture for Si/SiGe quantum dots", Applied Physics Letters, 2015, 223507, vol. 106.
Mi, X.et al., "High Resolution Valley Spectroscopy of Si Quantum Dots", Phys. Rev. Lett., 2017, 176803, vol. 119.
Schoenfield, J.S. et al., "Coherent manipulation of valley states at multiple charge configurations of a silicon quantum dot device". Nature Communications, 2017, p. 64, vol. 8.
Thorgrimsson, B. et al., "Extending the coherence of a quantum dot hybrid qubit. npj", Quantum Information, 2017, p. 32, vol. 3.
Borselli, M. et al., "Pauli spin blockade in undoped si/sige two-electron double-quantum dots", Appl. Phys. Lett., 2011, 063109, vol. 99.
Shi, Z. et al., "Coherent quantum oscillations and echo measurements of a si charge qubit", Phys. Rev. B, 075416, vol. 88.
Wu, X. et al., "Two-axis control of a singlet-triplet qubit with an integrated micromagnet", Proc. Natl. Acad Sci USA, 2014, pp. -11938-11942, vol. 111.
Harvey-Collard, P. et al., "Coherent coupling between a quantum dot and a donor in silicon", Nature Communications, 2017, p. 1029, vol. 8.
Rudolph, M. et al., "Coupling MOS Quantum Dot and Phosphorus Donor Qubit Systems", IEEE Int. Electron Dev. Meet, 2016, 34.1. 1-34.1.4.

Rossler, U. et al., "Microscopic interface asymmetry and spin-splitting of electron subbands in semiconductor quantum structures", Solid State Commun., 2002, pp. 313-316, vol. 121.
Golub, L.E. et al., "Spin Splitting in Symmetrical SiGe Quantum Wells", Phys. Rev. B, 2004, 115333.
Nestoklon, M.O. et al., "Spin and valley-orbit splittings in SiGe/Si heterostructures", Phys. Rev. B, 2006, 235334, vol. 73.
Prada, M. et al., "Spin-orbit splittings in Si/SiGe quantum wells: from ideal Si membranes to realistic heterostructures", New Journal of Physics, 2011, 013009, vol. 13.
Nestoklon, M.O. "Electric field effect on electron spin splitting in SiGe/Si quantum wells", Phys. Rev. B, 2008, 155328, vol. 77.
Ferdous, R. et al., "Valley dependent anisotropic spin splitting in silicon quantum dots", Preprint at http://arxiv.org/abs/1702.06210, 2017.
Ferdous, R. et al., "Interface induced spin-orbit interaction in silicon quantum dots and prospects for scalability" Preprint at http://arxiv.org/abs/1703.03840, 2017.
Huang, W. et al., "Electrically driven spin qubit based on valley mixing", Physical Review B, 2017, 075403, vol. 95.
Ruskov, R. et al., "Electron g-factor of valley states in realistic silicon quantum dots", Preprint at http://arxiv.org/abs/1708.04555, 2017.
Alekseev, P.S. et al., "Effective one-band approach for the spin splittings in quantum wells", Physical Review B, 2017, 125303, vol. 95.
Botzem, T. et al., "Quadrupolar and anisotropy effects on dephasing in two-electron spin qubits in GaAs", Nature Communiations, 2016, 11170, vol. 7.
Fujita, T. et al., "Coherent shuttle of electron-spin states", Quantim Information, 2017, p. 22, vol. 3.
Maurand, R. et al. "A CMOS silicon spin qubit", Nature Communications, 2016, 13575, vol. 7.
Manchon, A. et al., "New perspectives for Rashba spin-orbit coupling", Nature Materials, 2015, pp. 871-882, vol. 14.
Soumyanarayanan, A. et al., "Emergent phenomena induced by spin-orbit coupling at surfaces and interfaces", Nature, 2015, pp. 509-517, vol. 539.
Lidar, D. A. et al., "Decoherence Free Subspaces for Quantum Computation", Phys. Rev. B, 1998, pp. 2594-2597, vol. 81.
Harvey-Collard et al., "High-fidelity single-shot readout for a spin qubit via an enhanced latching mechanism", Preprint at http://arxiv.org/abs/1703.02651, 2017.
Yang, C.H. et al., "Spin-valley lifetimes in a silicon quantum dot with tunable valley splitting", Nature Communications, 2013, p. 2069, vol. 4.
Tahan, C. et al., "Relaxation of excited spin, orbital, and valley qubit states in ideal silicon quantum dots", Phys Rev B, 2014, 075302, vol. 89.
Hwang, J.C. et al., "Impact of g-factors and valleys on spin qubits in a silicon double quantum dot", Phys. Rev. B. 2017, 045302, vol. 96.
Dial, O.E. et al., "Charge Noise Spectroscopy Using Coherent Exchange Oscillations in a Singlet-Triplet Qubit", Physical Review Letters, 2013, 146804, vol. 110.
Assali, L. V. et al., "Hyperfine interactions in silicon quantum dots", Physical Review B, 2011, 165301, vol. 83.
Witzel, W. M. et al., "Nuclear spin induced decoherence of a quantum dot in Si confined at a SiGe interface: Decoherence dependence on 73Ge", Physical Review B, 2012, 205312, vol. 85.
Witzel, W.M. et al., "Quantum Decoherence of the Central Spin in a Sparse System of Dipolar Coupled Spins", Phys. Rev. B, 2012, 035452, vol. 86.
Petta, J.R. et al., "Coherent Manipulation of Coupled Electron Spins in Semiconductor Quantum Dots", Science, 2005, pp. 2180-2184, vol. 309.
Peterson, K.D. et al., "Quantum Coherence in a One-Electron Semiconductor Charge Qubit", Physical Review Letters, 2010, 246804, vol. 105.
Foletti, S. et al., "Universal quantum control of two-electron spin quantum bits using dynamic nuclear polarization", Nature Physics, 2009, pp. 903-908, vol. 5.

(56) References Cited

OTHER PUBLICATIONS

Nicol, J.M. et al., "High-fidelity entangling gate for double-quantum-dot spin qubits", 2017, p. 3, vol. 3.

Takeda, K. et al., "A fault-tolerant addressable spin qubit in a natural silicon quantum dot", Sci Adv., 2016, e1600694, vol. 2.

Friesen, M. et al., "Valley splitting theory of SiGe/ Si/ SiGe quantum wells", Phys. Rev. B, 2007, 115318, vol. 75.

Stepanenko, D et al., "Singlet-triplet splitting in double quantum dots due to spin-orbit and hyperfine interactions", Phys. Rev. B, 2012, 075416, vol. 85.

Johnson, A.C. et al., "Singlet-triplet spin blockade and charge sensing in a few-electron double quantum dot", Phys. Rev. B, 2005, 165308, vol. 72.

Studenikin, S.A. et al., "Enhanced charge detection of spin qubit readout via an intermediate state", Applied Physics Letters, 2012, 233101, vol. 10.

Mason, J.D. et al., "Role of metastable charge states in a quantum-dot spin-qubit readout", Physical Review B, 2015, 125434, vol. 92.

Nakajima, T. et al., "Robust Single-Shot Spin Measurement with 99.5% Fidelity in a Quantum Dot Array", Phys. Rev. Lett., 2017, 017701, vol. 119.

Broome, M. A. et al., "High-Fidelity Single-Shot Singlet-Triplet Readout of Precision-Placed Donors in Silicon", Physical Review Letters, 2017, 046802, vol. 119.

Hahn, E. L. et al., "Spin Echos", Phys. Rev., 1950, p. 580, vol. 80.

Loss, D. et al., "Quantum computation with quantum dots", Physical Review A, 1998, pp. 120-126, vol. 57.

Hanson, R. et al., "Spins in few-electron quantum dots", Rev. Mod. Physics, 2007, pp. 1217-1265, vol. 79.

Maune, B.M. et al., "Coherent singlet-triplet oscillations in a silicon-based double quantum dot", Nature, 2012, pp. 344-347, vol. 481.

Koppens, F.H. et al., "Driven coherent oscillations of a single electron spin in a quantum dot", Nature, 2006, pp. 766-771, vol. 442.

Pioro-Ladriere, M. et al., "Electrically driven single-electron spin resonance in a slanting Zeeman field", Nat. Phys., 2008, pp. 776-779, vol. 4.

Corna, A. et al., "Electrically driven electron spin resonance mediated by spin-valley-orbit coupling in a silicon quantum dot", Nature PJ Quantum Information, 2018, vol. 4.

Jock, R. M. et al., "A silicon metal-oxide-semiconductor electron spin-orbit qubit", Nature Communications, 2018, Article 1768, vol. 9.

Jock, R.M. et al., "Spin-orbit Coupling at the MOS Interface", Nature Communications, 2018, Supplementary Note, Article 1768, vol. 9.

Jock, R.M. et al., "Tunnel coupling tuning of a QD-donor S-T qubit", Sandia National Laboratories, 2017.

Kloeffel, C. et al., "Prospects for Spin-Based Quantum Computing in Quantum Dots", Annual Rev. Condens. Matter Phys. 2013, pp. 51-81, vol. 4.

Jock, R.M. et al., "Probing low noise at the MOS interface with spin-orbit qubit", Sandia National Laboratories, 2017.

Rudolph, M. et al., "Two-axis control of a coupled quantum dot-donor qubit in Si-MOS", Sandia National Laboratories, 2017.

\* cited by examiner

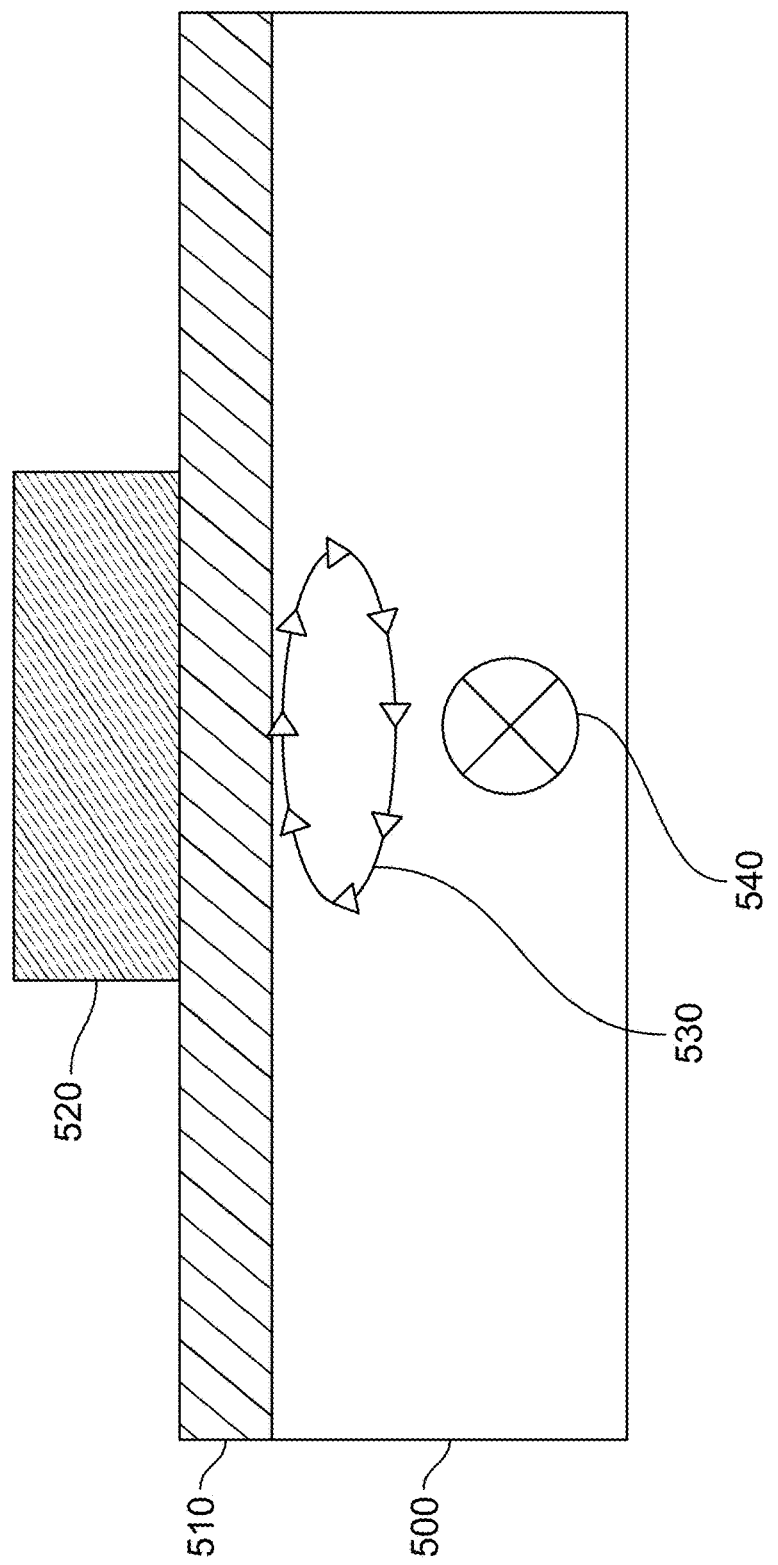

SPIN-ORBIT QUBIT USING QUANTUM DOTS

ACKNOWLEDGEMENT OF GOVERNMENT SUPPORT

This invention was made with Government support under Contract No. DE-NA0003525 awarded by the United States Department of Energy/National Nuclear Security Administration. The Government has certain rights in the invention.

FIELD OF THE INVENTION

The invention relates to circuit elements for quantum computing, and more specifically to qubits implemented using semiconductor materials.

ART BACKGROUND

Quantum computing differs from conventional computing because instead of storing and manipulating data in the form of binary bits, it uses quantum bits, which are commonly referred to as "qubits". Unlike a binary bit, which can exist in only one of two discrete states, a qubit can exist in any quantum superposition of its two qubit states. Likewise, algorithms are implemented in conventional computing by binary logic gates, but in quantum computing they are implemented using quantum gates that operate on the quantum superposition and that are read out by collapsing the final quantum superposition to a single, measurable state that is detectable by, e.g., electrical or optical probes.

Quantum computing has been a research subject of intense interest over the past few years because of its potential for solving problems in cryptography, simulation, and other areas that would be extremely costly, or even intractable, by conventional computation. Some of the research has been directed to the search for a physical implementation of a qubit that can maintain a quantum state for a sufficient coherence time to permit computational operations to take place. Of course, any such implementation must include an isolated particle or excitation that can be manipulated between two distinct quantum states.

For example, particle-based approaches have used the internal states of trapped ions or neutral atoms, the spin of confined electrons, and even nuclear spins of dissolved molecules and dopant ions in solid state materials. Other examples come from the field of superconducting quantum computing. In those examples, the different quantum states might be, e.g., different numbers of Cooper pairs on a superconducting island, different numbers of magnetic flux quanta trapped in a superconducting ring, or different amplitudes of charge oscillation across a Josephson junction.

Approaches based on confined electrons are especially interesting because as a spin-½ particle, the electron inherently has precisely two mutually orthogonal spin states (often referred to as "spin up" and "spin down"). Moreover, the technology is available for electrostatically isolating individual electrons, for manipulating spin states using electric and/or magnetic fields, and for detecting the presence of confined electrons in individual quantum dots. (For reasons to be explained below, manipulations that change the quantum state of the confined electrons are referred to as "state rotations".)

In 1998, for example, Daniel Loss and David P. DiVincenzo proposed one-qubit and two-qubit gates using the spin states of coupled single-electron quantum dots. Logical operations would be performed through gating of a tunneling barrier between neighboring dots. Their proposal is described in D. Loss et al., "Quantum computation with quantum dots," *Phys. Rev. A* 57 (Jan. 1, 1998A) 120-126, the entirety of which is hereby incorporated herein by reference.

Various physical implementations of the ideas of Loss and DiVincenzo have been attempted since the publication of their article. One such implementation is the lateral gate quantum dot, or, simply, the "lateral dot" as discussed, for example, in R. Hanson et al., "Spins in few-electron quantum dots," *Rev. Mod. Physics* 79 (October-December 2007) 1217-1265, the entirety of which is hereby incorporated herein by reference.

In one example provided by Hanson et al., a two-dimensional electron gas (2 DEG) forms at the interface between a gallium arsenide (GaAs) substrate and an overlayer of aluminum gallium arsenide (AlGaAs) grown by molecular beam epitaxy (MBE). Metal gate electrodes are deposited over the GaAs—AlGaAs heterostructure and patterned by electron-beam lithography. Negative voltages on the gate electrodes locally deplete the 2 DEG and in that way can be used to isolate small islands of electrons, thereby defining the quantum dots. 2 DEG reservoirs in the patterned structure are provided with ohmic contacts. The device is operated at cryogenic temperatures, typically 20 mK.

One of the examples that Hanson et al. provides is the double quantum dot. In a double quantum dot, electrons can be transferred through a tunnel barrier from one dot to the other by changing the electrostatic potentials applied through the gate electrodes to the respective dots. (When both dots are at the same potential, they are said to be "in resonance". When they are out of resonance, they are said to be "detuned". The amount of detuning is described by a potential difference $\varepsilon$.) However, some interdot charge transitions, i.e., some transfers of an electron from one dot to the other are forbidden by spin selection rules.

The charge states (i.e., the occupancy types) of the double dot that are of interest are (0,1), (1,1), and (0,2), in which, respectively, one dot is empty and one dot is occupied by a single electron, each dot is occupied by a single electron, and one dot is empty and the other dot is occupied by two electrons.

The two-electron ground state is the singlet state. For the (0,2) charge state, it is represented by $$S(0,2)=(|\uparrow_2\downarrow_2\rangle-|\downarrow_2\uparrow_2\rangle)/\sqrt{2},$$

where the arrow direction indicates "spin up" or "spin down" respectively, and the subscript indicates that the electron resides in dot i, where i=2. For the (1,1) charge state, the singlet spin state is represented by $$S(1,1)=(|\uparrow_1\downarrow_2\rangle-|\downarrow_1\uparrow_2\rangle)/\sqrt{2}.$$

The stationary states next higher in energy are the manifold of three triplet states. However, a magnetic field applied at sufficient strength will split the triplet states, and it will effectively remove the T+ and T− (m=1) triplet states from consideration. The remaining triplet state is the $T_0$ state. For the (0,2) charge state, the remaining triplet is represented by $$T_0(0,2)=(|\uparrow_2\downarrow_2\rangle+|\downarrow_2\uparrow_2\rangle)/\sqrt{2}.$$

For the (1,1) charge state, it is represented by:

$$T_0(1,1)=(|\uparrow_1\downarrow_2\rangle+|\downarrow_1\uparrow_2\rangle)/\sqrt{2}.$$

The so-called "exchange energy" is the energy difference J between the S and $T_0$ states. The exchange energy is very strongly affected by hybridization of the electron wavefunctions when electrons are partially transferred from one dot to the other. As a consequence, the exchange energy is very sensitive to the detuning, $\varepsilon$.

Hanson et al. explains how the detuning can be used to perform state rotations on the confined electrons. The possible pure quantum states $|\Psi(\theta,\varphi)\rangle$ that are linear combinations of the S and $T_0$ states can be expressed in the form $$|\Psi(\theta,\varphi)\rangle = \cos(\theta/2)|S\rangle + \exp(i\varphi)\sin(\theta/2)|T_0\rangle,$$

where the polar angle $\theta$ varies from 0° to 180° and the azimuthal angle $\varphi$ varies from 0° to 360°.

Two of the possible states that can be reached with suitable values of $\theta$ and $\varphi$, are $|\uparrow\downarrow\rangle$ and $|\uparrow\downarrow\rangle$. (The charge state is neglected here to simplify the discussion.) The exchange energy $J(\varepsilon)$ mixes these states, so that an initial $|\uparrow\downarrow\rangle$ state will evolve into a $|\downarrow\uparrow\rangle$ state in a time $\tau$ given by the expression $\tau = \pi\hbar/J(\varepsilon)$. (The symbol $\hbar$ represent s Planck's constant.)

The two states are related by a difference of 180° between their respective values of $\varphi$. In fact, these states can be represented as antipodal points on the surface of a sphere, referred to as the "Bloch sphere". Each point on the surface of the Bloch sphere represents one of the states $|\Psi(\theta,\varphi)\rangle$ referred to above. Accordingly, the evolution of the $|\uparrow\downarrow\rangle$ into the $|\downarrow\uparrow\rangle$ state may be regarded as a 180° rotation on the equator of the Bloch sphere about the polar, or "Z", axis. (It is noteworthy in this regard that the 180° Z-rotation on the equator of the Block sphere corresponds to a two qubit SWAP operation between two single-electron spin-½ qubits, and a similar 90° rotation corresponds to a √SWAP operation. These are fundamental operations of quantum logic that are well known to those skilled in the art of quantum computation.)

Thus, a suitably programmed voltage pulse applied to the gate electrodes can produce any desired rotation (i.e., a "Z-rotation") of a suitably prepared initial state around the equator of the Bloch sphere.

All possible two-electron spin states of the double dot, i.e., all points on the surface of the Bloch sphere, could be reached by combining a Z-rotation with an X-rotation, i.e., with a rotation about an axis perpendicular to the Z axis, so that $\theta$, rather than $\varphi$, is varied.

Researchers in the field have in fact proposed various approaches to two-axis control. For example, an approach for two-axis control of singlet-triplet qubits in GaAs/AlGaAs has been published in J.R. Petta et al., "Coherent manipulation of coupled electron spins in semiconductor quantum dots," *Science* 309, 2180-2184 (2005). Approaches for two-axis control of singlet-triplet qubits in Si/SiGe have been published in B. M. Maune et al., "*Coherent singlet-triplet oscillations in a silicon-based double quantum dot,*" *Nature* 481, 344-347 (2012), and in X. Wu et al., "Two-axis control of a singlet-triplet qubit with an integrated micromagnet," *Proc. Natl Acad. Sci. USA* 111, 11938-11942 (2014).

Approaches for two-axis control of single-spin (spin-½) qubits in GaAs/AlGaAs have been published in F. H. L. Koppens et al., "Driven coherent oscillations of a single electron spin in a quantum dot," *Nature* (London) 442, 766-771 (2006), and in M. Pioro-Ladrière et al., "Electrically driven single-electron spin resonance in a slanting Zeeman field," *Nat. Phys.* 4, 776-779 (2008).

An approach for two-axis control of single-spin (spin-½) qubits in Si/SiGe has been published in E. Kawakami et al., "Electrical control of a long-lived spin qubit in a Si/SiGe quantum dot," *Nat. Nano* 9, 666-670 (2014).

Approaches for two-axis control of single-spin (spin-½) qubits in MOS have been published in M. Veldhorst et al., "An addressable quantum dot qubit with fault-tolerant control-fidelity," *Nat. Nano* 9, 981-985 (2014), and in A. Corna et al., "Electrically driven electron spin resonance mediated by spin-valley-orbit coupling in a silicon quantum dot," *Nature PJ Quantum Information* 4, Article number 6 (2018), (seven pages), www.nature.com/npjqi.

The entirety of each of the above-cited references is hereby incorporated herein by reference.

Although two-axis control is described in the above-cited references among others, the approaches that are known until now call for large on-chip microwave strip-lines, controlled hyperfine interactions with material nuclear spins, precisely-positioned nanomagnets, or specialized fin geometries for corner-QD effects.

If, on the other hand, two-axis control could be achieved through simple control of electrical voltages and currents, it would open up further possibilities for the design of quantum logic gates. Thus, there remains a need for simpler and more practical implementations that offer two-axis control of the spin state in lateral double dots.

SUMMARY OF THE INVENTION

We have demonstrated, for the first time, two-axis control of a singlet-triplet qubit in a MOS double quantum dot (DQD).

Single spin (spin-½) qubits have previously been demonstrated in the silicon metal-oxide semiconductor (MOS) material system, and two-qubit gates have been demonstrated in a MOS DQD. However, in contrast to approaches of the prior art, we achieved two-axis control in the MOS DQD system, and we were able to achieve it through simple control of electrical voltages and currents without the need for microwave striplines, micromagnets, or other specialized structures.

In an example device according to our new approach, a 2 DEG forms at the interface between the silicon substrate and an overlying silicon oxide layer. When the electrons in the 2 DEG are confined to a quantum dot and subjected to a magnetic field having a component directed parallel to the interface, the interfacial asymmetry creates an effective magnetic field that perturbs the energies of the spin states via an interaction that we refer to as the interface spin-orbit (SO) interaction.

We have harnessed this interaction in a manner that controllably produces X-rotations of the electronic spin state in a double quantum dot (DQD) singlet-triplet (ST) qubit. By combining this with the utilization of the exchange energy to produce Z-rotations, we have provided all-electrical two-axis control of the two-electron spin state. That is, the desired state rotations are controlled solely by the use of electrical pulses.

It is noteworthy in this regard that because the interfacial spin-orbit effect (which is inherent to the system we are describing) may be used to control qubits, it can lead to implementations of both singlet-triplet and single-spin qubit architectures.

Moreover, we have implemented a design that is remarkably simple, requiring only a single-gate-layer polysilicon electrode and silicon MOS gate stack. Although not essential for operation of an interfacial spin-orbit qubit, our design offers a straightforward, low-overhead pathway for, and design advantages for, the large-scale integration of qubits in complex layouts for quantum computing.

Our design has relatively few layers, in particular only a single gate layer (i.e., all gate electrodes are formed in one layer). Some of the potential design advantages include low overhead, low stress, improved impurity gettering, low drift, and the ability to use donor implantation, high-temperature anneal for damage repair, and other advantageous features of MOS processing.

It is important to note that although our ideas are presented here in the context of an MOS system, the same concept may also be applicable to other semiconductor systems, provided they have sufficiently tunable interface spin-orbit coupling strengths. Hence the examples based on MOS should be understood as illustrative and non-limiting.

Accordingly, the invention in a first aspect involves a method of quantum information processing using a lateral double quantum dot (DQD). The DQD is disposed at a substrate surface, and it has a first quantum dot ($QD_1$) tunnel-coupled to a second quantum dot ($QD_2$). By "at a substrate surface" is meant that the electronic confinement in the quantum dots is responsive to electrodes that overlie and interact with the substrate surface. The confined electronic population may be, for example, substantially within the substrate near the substrate surface, or substantially within an interface between the substrate and an overlying layer of oxide or other material.

The method includes populating $QD_1$ with two confined electrons, transferring one confined electron to $QD_2$ to create a (1, 1) charge state, performing at least two state rotations on the confined electrons while the DQD is in the (1, 1) charge state, and reading out a final quantum state of the DQD.

The at least two state rotations are performed while exposing the DQD to an externally sourced magnetic field having a component directed parallel to the substrate surface. The operation for performing each of these rotations consists of applying a voltage pulse sequence to a planar gate electrode or combination of planar gate electrodes that is electrostatically coupled to the confined electrons so as to vary a relative tuning between $QD_1$ and $QD_2$.

By "consists of" is meant that except for the voltage pulses applied to the electrostatically coupled electrodes, no other type of signal is applied to effectuate the rotations. Thus, for example, signals delivered by microwave stripline and relying on the microwave magnetic field are excluded.

By "planar gate electrode" is meant an electrode that is substantially flat and does not rely for its operation on three-dimensional effects such as effects due to wrapping around an edge of the underlying material. The term "planar" also excludes, for example, electrodes provided in fin geometries.

At least a first one of the voltage pulse sequences comprises maintaining, for a first specified duration, a first relative tuning between $QD_1$ and $QD_2$. At least a second one of the voltage pulse sequences comprises maintaining, for a second specified duration, a second relative tuning between $QD_1$ and $QD_2$ that is different from the first relative tuning.

In embodiments, $QD_1$ and $QD_2$ are laterally disposed relative to each other.

In embodiments, the populating, transferring, state-rotation-performing, and readout steps are cyclically repeated multiple times.

In embodiments, $QD_1$ and $QD_2$ are formed by applying voltages to planar gate electrodes that overlie the substrate surface.

In embodiments, the substrate surface is a surface of a silicon body, and wherein the surface of the silicon body is directly overlain by a layer of silicon oxide.

In embodiments, the state-rotating voltage-pulse sequences are applied to a single layer of polysilicon planar gate electrodes that overlie the layer of silicon oxide.

In embodiments, at least one of the state rotations is, at least in part, a rotation between singlet and triplet states of the DQD, and at least one of the state rotations is, at least in part, a rotation between $|\uparrow\downarrow\rangle$ and $|\downarrow\uparrow\rangle$ states of the DQD.

In a second aspect, the invention involves a method of quantum information processing using a single-electron spin qubit embodied in a quantum dot (QD) disposed at a silicon substrate surface overlain by a layer of silicon oxide.

The method comprises populating the QD with a confined electron having two spin states relative to a quantization axis, performing at least one state rotation on the confined electron, and reading out a final quantum state of the QD.

The at least one state rotation is performed while exposing the QD to an externally sourced magnetic field having a component directed parallel to the substrate surface. The QD has a tuning state that moves up and down in energy in response to a voltage applied to a controlling gate electrode arrangement. The performing of the at least one state rotation consists of applying a voltage pulse sequence to the controlling gate electrode arrangement. The voltage pulse sequence is effective to invoke an effective magnetic field perpendicular to the quantization axis of the spin state of the QD electron and to induce spin state rotations.

In a third aspect, the invention involves an apparatus for quantum information processing. The apparatus comprises a silicon substrate having a substrate surface, a silicon oxide layer overlying the substrate surface, and a single electrode layer overlying the silicon oxide layer. By "single electrode layer" is meant that all of the gate electrodes are formed in the same one layer. The single electrode layer is composed of polysilicon and patterned into an arrangement of planar electrodes.

The apparatus further comprises a signal generator, a voltage source, and a readout circuit.

The planar electrode arrangement is conformed to induce a laterally disposed double quantum dot (DQD) to form at the substrate surface under application of suitable voltages, the DQD comprising two tunnel-coupled quantum dots (QDs). Each of the QDs has a tuning state that moves up and down in energy in response to a voltage signal applied to part of the planar electrode arrangement. The planar electrode arrangement includes at least one planar electrode connected to the readout circuit for reading out charge states of the DQD.

The voltage source is connected directly to a portion of the planar electrode arrangement and conformed to respond to waveforms from the signal generator by applying the waveforms to the planar electrode arrangement such that differential voltages are applied to the respective QDs of the DQD so that the respective QDs are driven to different tuning states. The signal generator is conformed to drive state-rotating pulse sequences from the voltage source.

In embodiments, the apparatus further comprises a magnetic field source conformed to apply to the silicon substrate a magnetic field having a component parallel to the substrate surface.

BRIEF DESCRIPTION OF THE DRAWINGS

FIG. 5 is a schematic cross-sectional drawing of a silicon substrate overlain by a silicon oxide layer, which is useful for fabricating an example single-electron spin qubit as described here.

DETAILED DESCRIPTION

Introduction

The spin-orbit (SO) interaction is a coupling of an elementary particle's spin with an effective magnetic field experienced by the particle due to its motion within an electric field. This interaction can lead to an energy splitting between different spin states of the electron, similar to the well-known Zeeman effect in which an applied magnetic field splits atomic spectral lines. In reference to the Zeeman effect, the splitting due to the SO interaction is also sometimes referred to as a "Zeeman splitting". Below, the term "Zeeman splitting" will be used in reference to energy splittings between spin states that are due to SO interactions as well as those that are directly due to an externally applied magnetic field.

Simple treatments of an electron interacting in vacuum with a magnetic field B give the interaction energy $H_{SO}$ as $$H_{SO} = -[g_S \mu_B / \hbar] B \cdot S,$$

where $g_S$ is the g-factor of the electron spin, $\mu_B$ is the Bohr magneton, and S is the electronic spin angular momentum vector. (More specifically, S is a quantum mechanical operator expressible in terms of the Pauli matrices for spin ½, which are discussed below.) However, the interaction energy in anisotropic materials calls for a more detailed treatment, in which $g_S$ is replaced by a g-tensor.

Figure 1:
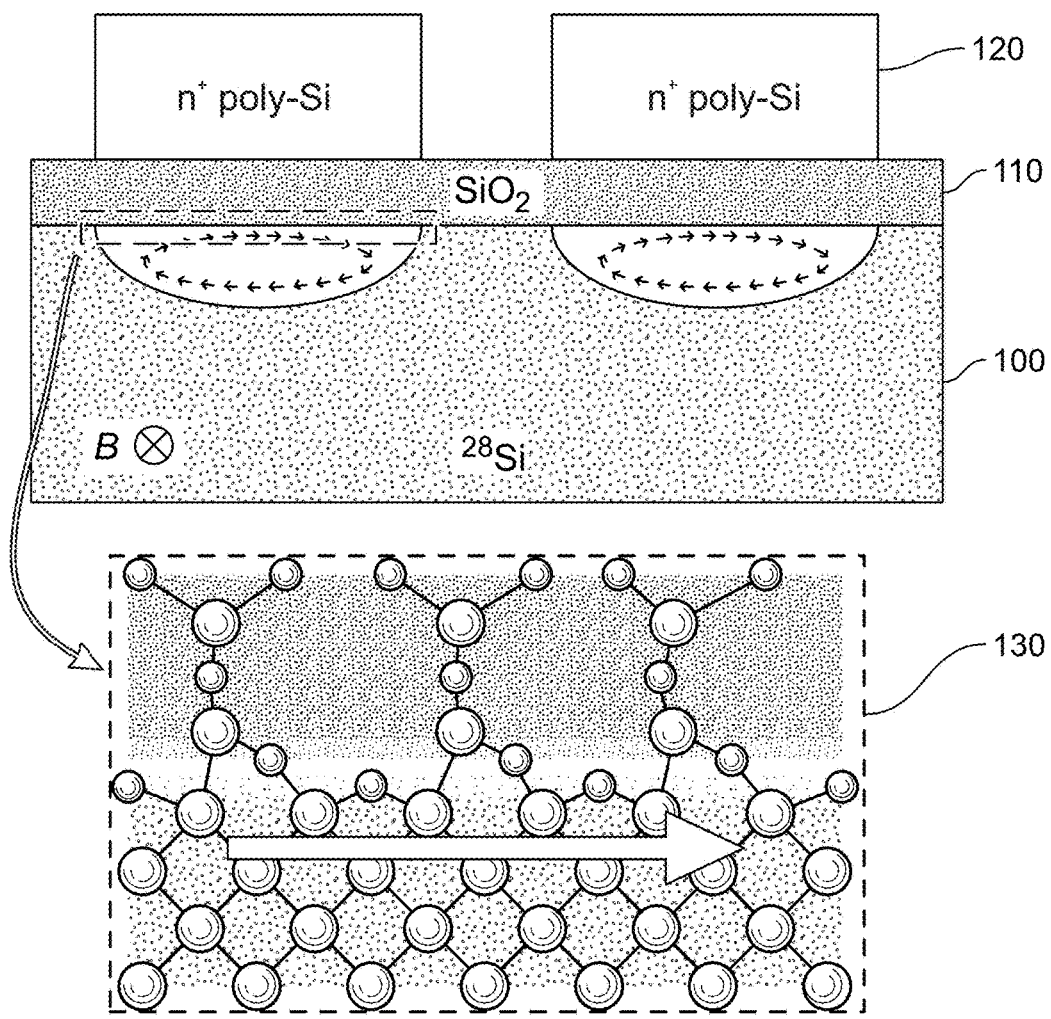
FIG. 1 is a schematic cross-sectional drawing of a silicon substrate overlain by a silicon oxide layer, which is useful for fabricating example devices as described here.

FIG. 1 shows such an anisotropic material. More specifically, FIG. 1 shows, in schematic cross section, a silicon substrate 100 isotopically enriched with $^{28}$Si and overlain by a silicon oxide layer 110. (The silicon needs to be isotopically enriched because the isotopic abundance of spin-½ $^{29}$Si nuclei in natural silicon is sufficient to affect the local magnetic field experienced by the confined electrons and thereby add noise to the desired state rotations).

The silicon oxide layer, in turn, is overlain by a n$^+$-doped layer 120 of patterned polysilicon electrodes as shown in FIG. 1. A detail 130 of the figure provides a magnified view of the interface between the silicon and the silicon oxide. As indicated in the figure, an applied magnetic field $B_{applied}$ has a component directed parallel to the interface. (In the figure, the direction of $B_{applied}$ is shown as passing perpendicularly into the plane of the paper.) Positive voltages on the polysilicon electrodes induce a 2 DEG in the substrate near the interfacial region. As shown by directed loops in the figure, the field $B_{applied}$ causes electrons in the 2 DEG to undergo a circulatory cyclotron motion.

Due to the cyclotron motion and the inversion asymmetry at the interface, the electronic motion acquires a non-zero net momentum component along the interface. There is also an effective electric field at the interface having a normal component, i.e., a component perpendicular to the electronic momentum along the interface. The coupling between mutually perpendicular components of electronic momentum and effective electric field gives rise to an effective magnetic field $B_{eff}$. This effective magnetic field $B_{eff}$ produces an SO interaction that is additive to the SO interaction produced by the applied magnetic field.

Two contributions to the effective electric field are especially germane. The so-called Rashba contribution relates to a vertical field at the silicon/SiO$_2$ boundary due to the confining gate potentials and to the structural inversion asymmetry across the interface.

The so-called Dresselhaus contribution occurs in materials, including bulk materials, that lack inversion symmetry. It has a microscopic origin. Silicon does in fact have bulk inversion symmetry; the Dresselhaus contribution instead arises (in the system described here) from interatomic fields at the interface or between silicon and oxygen atoms. In effect, these dipole fields are sampled by the electronic momentum, yielding a net contribution over many atoms. Even though silicon-dioxide is largely amorphous, the Dresselhaus contribution is generally dependent on crystallographic orientation. This is understood to be due to residual order that extends somewhat into the layer of silicon oxide when it is grown.

The Rashba and Dresselhaus contributions to the SO interaction can be subsumed into an effective Zeeman Hamiltonian $H_{eff}$:

$$H_{eff} = \frac{\mu_B}{2} B \cdot g \cdot \sigma.$$

Here, B is the applied magnetic field vector (the subscript will be dropped in the rest of this discussion), σ is the vector of Pauli spin matrices ($\sigma_x$, $\sigma_y$, $\sigma_z$), and g is the effective g-tensor which, in a useful approximation, is given by $$g = \begin{pmatrix} g_\perp - \frac{2}{\mu_B}\alpha & \frac{2}{\mu_B}\beta & 0 \\ \frac{2}{\mu_B}\beta & g_\perp - \frac{2}{\mu_B}\alpha & 0 \\ 0 & 0 & g_\| \end{pmatrix},$$

where $g_\perp$ is the g-tensor component for the directions perpendicular to the [001] valley of bulk silicon, $g_\|$ is the g-tensor component for the directions parallel to [001] the valley of bulk silicon, and $\alpha$ and $\beta$ are the respective corrections to the g-tensor due to the Rashba and Dresselhaus SO coupling. (It is assumed here that the growth direction for the structure of FIG. 1 is the z-direction, i.e., in the direction of the [001] crystallographic axis.)

The strength of the SO interaction will depend on the applied electric field, the lateral confinement, the valley-orbit configuration, and the atomic-scale structure of the interface. As a consequence, the local interfacial and electrostatic environments will be particular to each QD. Because these environments will differ between the respective QDs, there will likewise be differences between their effective g-tensors.

The differences between the effective g-tensors are manifested as differences in the effective in-plane magnetic field. But it is the in-plane magnetic field that produces, in each QD, the Zeeman splittings in energy between the different spin states. Hence the local variations in the effective g-tensor will cause the electron spins in the respective dots of the pair to have different spin splittings.

More specifically, the S-$T_0$ spin splitting will differ between the left-hand and right-hand dots by an amount $\Delta_{SO}$. This energy difference $\Delta_{SO}$ will drive X-rotations on the Bloch sphere between the S(1,1) and $T_0$(1,1) states at a frequency $f_{rot}(\theta, \varphi)$ given theoretically by:

$$f_{rot}(\theta, \varphi) = \frac{\Delta_{SO}(\theta, \varphi)}{h} = \frac{\Delta g(\theta, \varphi)\mu_B B}{h} = \frac{2}{h}|\langle S|H_{eff}|T_0\rangle| = |B||\Delta\alpha - \Delta\beta \sin(2\varphi)|\sin^2(\theta),$$

where $h = 2\pi\hbar$, $\varphi$ is the direction of the in-plane component of the applied field B as measured with respect to the [100] crystallographic direction (i.e., as measured azimuthally from the x-axis), $\theta$ is the out-of-plane angle of B as measured relative to the [001] crystallographic direction (i.e., as measured from the z-axis), and $\Delta\alpha$ and $\Delta\beta$ quantify the differences between the two QDs in the Rashba and Dresselhaus g-tensor perturbations, respectively.

Those skilled in the art will understand from the above equation that the frequency of X-rotation is proportional to the applied magnetic field. It will also be understood that the rotation frequency depends on the difference $$\frac{\Delta g \mu_B}{h}$$

in gyromagnetic ratio between the two dots of the QD pair. In practice, the operator will have some ability to select $\Delta g$ by using suitable voltages on the gate electrodes to control the vertical confinement of the induced 2 DEG, thereby modulating the overlap of the electron with the silicon/silicon-dioxide interface.

As explained above, coupling between states via the exchange energy J can be exploited to cause Z-rotations of the DQD spin state. In addition, as we have just shown, the coupling between states due to differences in the Rashba and Dresselhaus perturbations can be exploited to cause X-rotations of the DQD spin state. Through combinations of these two approaches, access can be afforded to any desired spin state of the DQD.

Apparatus

Figure 2A:
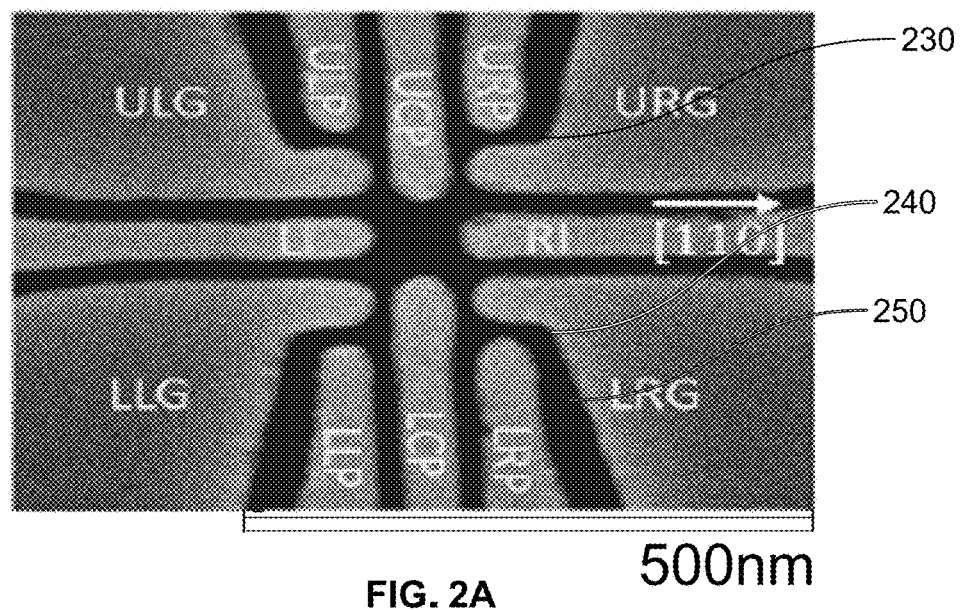
FIGS. 2A and 2B are respectively a plan view and a perspective view of an example double quantum dot (DQD) that is useful in the implementation of example devices as described here.
Figure 2B:
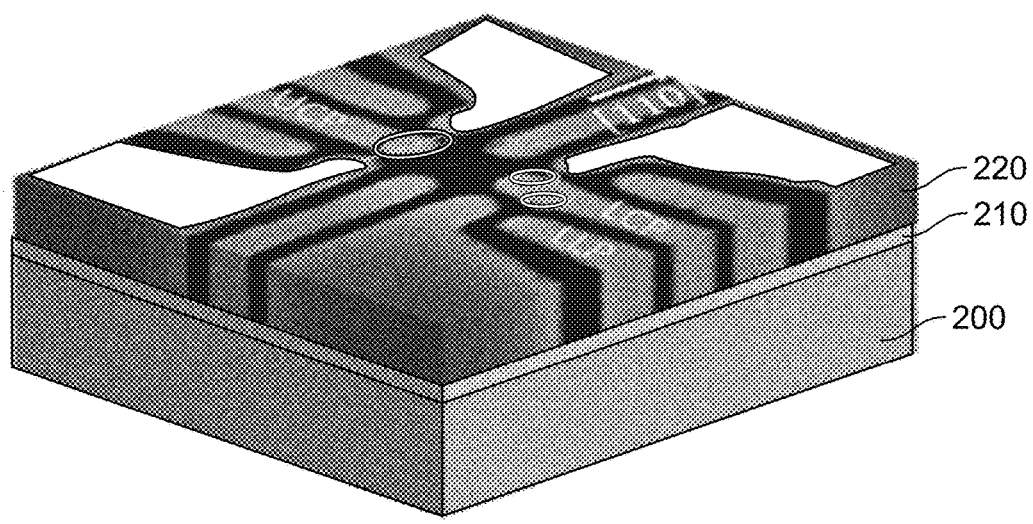

An example DQD is shown in plain view in FIG. 2A and in perspective view in FIG. 2B. Viewing the two figures together, it will be seen that a silicon substrate 200 is overlain by a silicon oxide layer 210 and over that, a patterned $n^+$-doped polysilicon electrode layer 220. Example layer thicknesses are 35 nm for the silicon oxide and 200 nm for the polysilicon. In our experiments, the top part of the silicon substrate was an epitaxially enriched $^{28}$Si epilayer with 500 ppm residual $^{29}$Si.

The [110] crystallographic direction is indicated by an arrow in each figure. The growth direction is [001]. Four large gate electrodes shown in the corners of FIG. 2A are respectively labeled ULG, URG, LRG, and LLG (for "upper left gate", etc.) The 2 DEG reservoirs used in our experiments were below the ULG, URG, and LRG gates. A pair of narrow gates aligned on the vertical centerline of FIG. 2A are respectively labeled UCP and LCP (for "upper and lower center plunger", respectively). A pair of narrow gates aligned on the horizontal centerline of FIG. 2A are respectively labeled LI and RI (for "left and right isolation", respectively).

Charge sensing is used to read out the spin state of the DQD. Charge sensing is performed here using a single electron transistor (SET). The curved arrow 230 in FIG. 2B indicates the current path through the charge sensor from the 2 DEG reservoir below gate ULG to the reservoir below gate URG. It should be noted in this regard that SET charge sensing is only one of several known readout techniques that are known in the art, and that it is presented here only as a non-limiting example.

Two circles 240, 250 added to FIG. 2B indicate the approximate locations of the two quantum dots that together make up the DQD. As seen in the figure, both dots underlie gate LCP. Dot 240, which is the dot closer to gate LRG, is denominated $QD_1$, and dot 250 is denominated $QD_2$ in the discussion below.

Procedures in which applied voltages are used to fill and empty the quantum dots are known in the art and insofar as they are general in application, they need not be described here in detail. A specific methodology for achieving two-axis control of the DQD spin state will be described below.

Details of the apparatus of FIGS. 2A and 2B and its operation are provided in Ryan M. Jock et al., "A silicon metal-oxide-semiconductor electron spin-orbit qubit," *Nature Communications* 9, Article number 1768 (2018), the entirety of which, including the Supplementary Material, is hereby incorporated herein by reference.

Method

Using pulse sequences described below, two electrons are electrostatically confined within a double well potential, where the dominant interaction between the electrons can be electrically tuned between two regimes. When the electronic wave functions of the QDs overlap significantly, the exchange energy J is dominant. But when the two electrons are well separated, J is small and instead, the dominant effect is an effective magnetic field gradient due to differences in interfacial SO coupling. (Below, we will refer to this effective magnetic field as the "gradient field".) The DQD can be switched between the two regimes through control of applied electric and magnetic fields.

Figure 3:
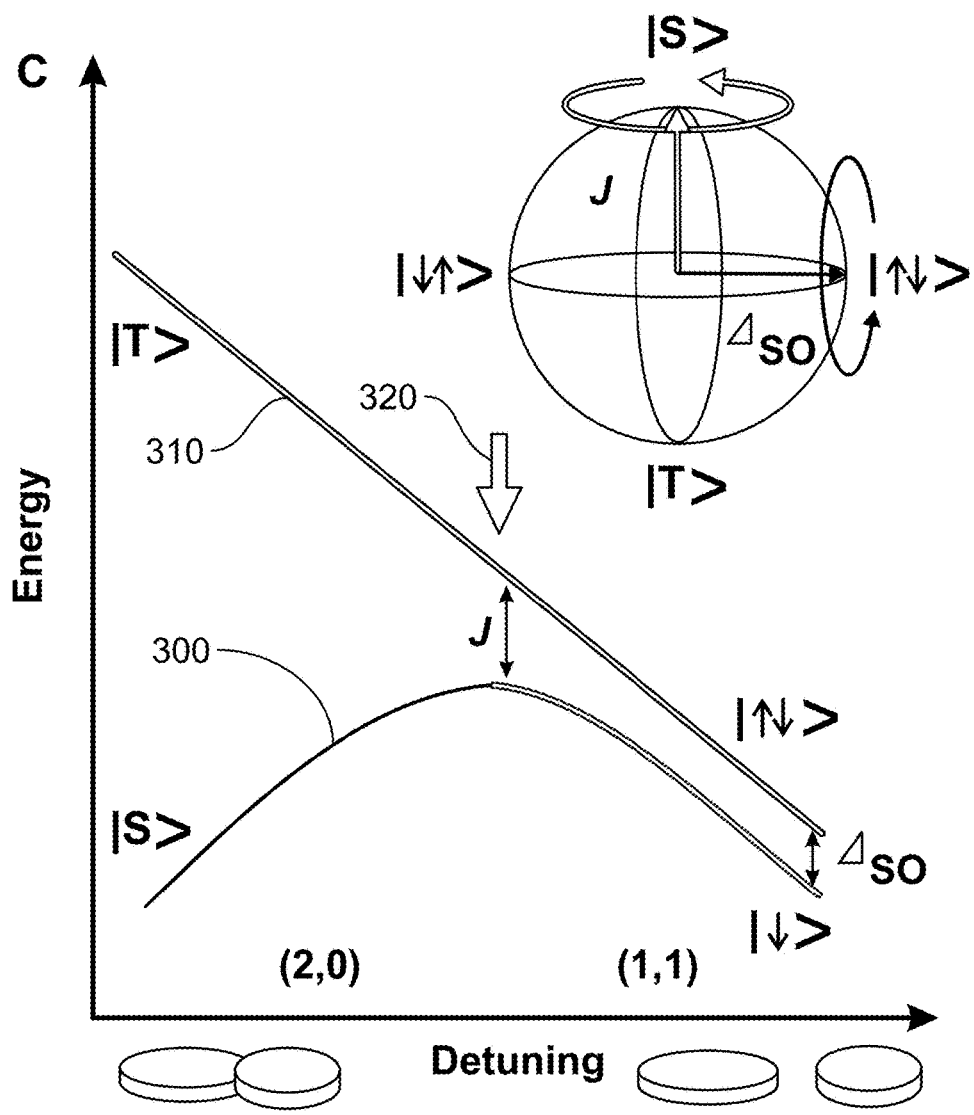
FIG. 3 is a schematic energy-level diagram. In the figure, the energies of the singlet and triplet states of a DQD near the (2, 0)→(1, 1) charge transition are plotted as functions of the relative quantum dot detuning ε.

This is illustrated in the schematic energy diagram of FIG. 3. In the figure, the energies of the singlet 300 and triplet 310 states near the (2, 0)→(1, 1) charge transition are plotted as functions of the QD-QD detuning $\epsilon$. Near the interdot transition 320 ($\epsilon$=0), the exchange energy J is seen to dominate the electronic interaction. In that regime, J drives rotations about the Z-axis. By contrast, J is seen to be small at detunings that go deep into the (1, 1) charge sector ($\epsilon$>0). There, the electronic states rotate about the X-axis due to a difference in the Zeeman energies between the two QDs.

The inset to the figure provides a view of the Bloch sphere. The Z-rotations are indicated by the legend "J" and by an arrow indicating rotation about the z-axis. The X-rotations are indicated by the legend "$\Delta_{SO}$" and by an arrow indicating rotation about the x-axis. As indicated in the figure, equatorial Z-rotations vary the mixture of $|\uparrow\downarrow\rangle$ and $|\downarrow\uparrow\rangle$ states, and meridional X-rotations vary the mixture of singlet and triplet states.

The singlet and triplet states of interest here are the two states S and $T_0$ of the m=0 subspace. They form a decoherence-free subspace relative to fluctuations in a uniform magnetic field, and they are chosen here as the computational basis. An applied magnetic field causes a Zeeman splitting of the m=±1 spin triplet states (respectively denominated $T^+$ (1, 1) and $T^-$ (1, 1)) from each other and from the m=0 state, thereby isolating the m=0 subspace.

A qubit state can be initialized in a singlet ground state S when the two QDs are electrically detuned out of resonance so as to favor the (2, 0) charge state. Rapid adiabatic passage (adiabatically transferring the charge, while diabatically transferring the spin state) from S(2, 0) produces a singlet state in the (1,1) charge configuration, i.e., S(1,1). The rapid adiabatic passage involves adiabatically transferring the charge, while diabatically transferring the spin state.

In this regard, it will be understood that in the adiabatic transition, the charge state evolves continuously so as to remain an eigenstate of the (spatial) electronic Hamiltonian. In the diabatic transition, by contrast, the spin state retains its physical character while the (spin) Hamiltonian changes. As a consequence, the spin state at the end of the transition is a superposition of the new (spin) eigenstates.

X-rotations are induced between the S(1, 1) and $T_0$(1, 1) states at the frequency $f_{rot}(\theta,\varphi)$ by utilizing the SO coupling, as discussed above. Z-rotations can be turned on by shifting the detuning (within the (1, 1) regime called out in the figure by reference numeral 300) closer to the charge anti-crossing where J is larger, driving oscillations around the equator of the Bloch sphere.

The spin state is detected using Pauli blockade in cooperation with a remote charge sensor. In our experiments, the remote charge sensor was an SET, as explained above.

Illustratively, the SET is capacitively coupled to the DQD, so that the current passed through the SET can be used to distinguish between different charge configurations of the DQD (e.g., (1,0), (1,1), (2,0), (2,1) . . . ). Spin is conserved in the charge-state transitions, so an initial singlet state remains a singlet state, and an initial triplet state remains a triplet state. If the qubit state (of the DQD) is initially S(1, 1), it can permissively pass to the S(2, 0) charge state because the electrons have opposite spins, thus satisfying the Pauli Exclusion Principle. However, the same principle prohibits an initial $T_0$(1, 1) state from passing to a triplet (2, 0) state in which the two electrons occupy the same orbital.

Under the available operating voltages, however, the next-higher orbital is energetically out of reach. The so-called Pauli blockade therefore locks the qubit in the state $T_0$(1, 1). The failure to transfer an electron (which would otherwise produce a (2, 0) charge state) during the readout stage can thus be interpreted as a $T_0$(1, 1) detection.

X-Rotations.

We will now describe X rotations more fully, with reference to FIGS. 4 and 5, which should be read in conjunction.

Figure 4A:
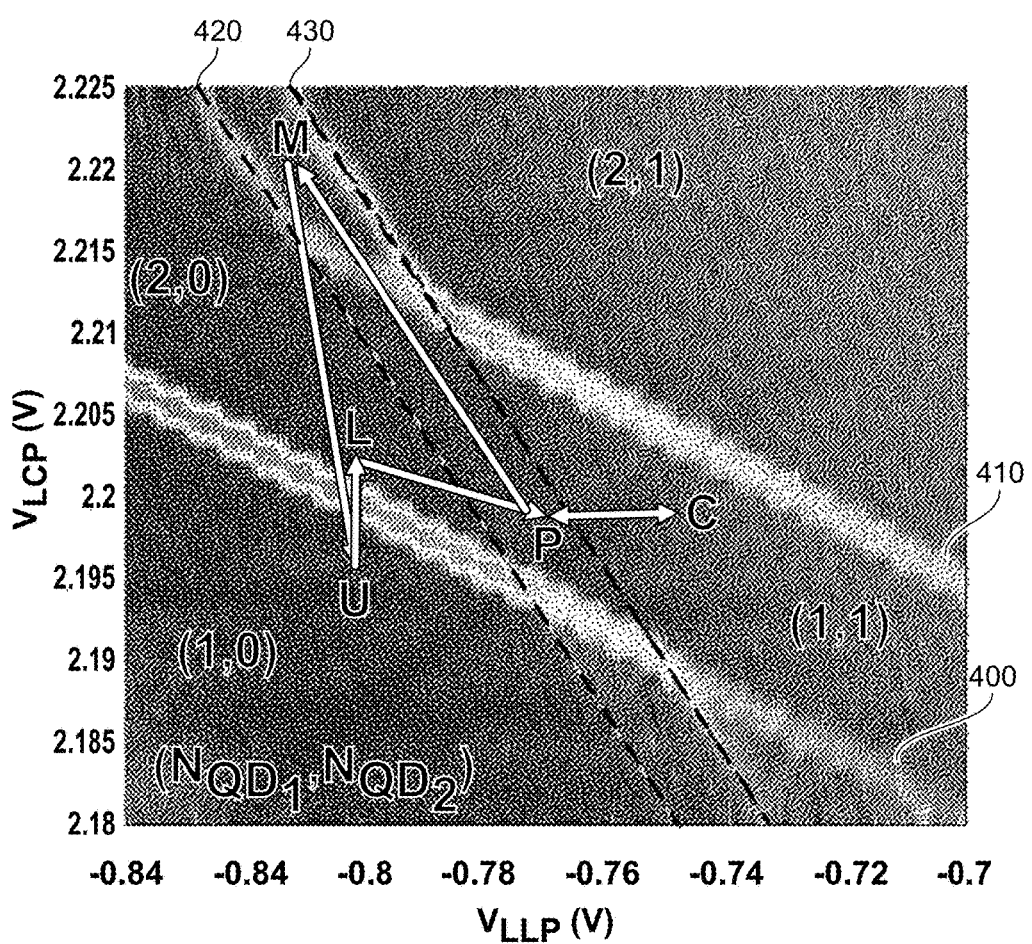
FIG. 4A is a pulsed charge stability diagram for the (2,0)→(1,1) anticrossing in an example DQD.

FIG. 4A is a pulsed charge stability diagram for the (2,0)→(1,1) anticrossing. An "anticrossing" in this regard is a region of the detuning space where hybridization of the electronic states causes them to diverge in energy. This is seen clearly in the energy level diagram of FIG. 4B, where the singlet and triplet states are seen to diverge as the detuning penetrates more deeply into the (1,1) region. The anticrossing 440 is also where (for a given two-electron spin state) neither of the two charge states is energetically favored over the other.

As will be seen below, the detuning can be determined in our example system by a pair ($V_{LLP}$, $V_{LCP}$) of gate voltages. In the resulting two-dimensional space, the anticrossing can be mapped to loci that we refer to as "charge-preserving lines". There are different charge-preserving lines for the singlet and triplet states, respectively.

FIG. 4A is derived from a contour plot, over ($V_{LLP}$, $V_{LCP}$), of the sensitivity of the charge sensor current to gate voltage. (More specifically, the figure is derived from contours of the gradient of the sensor current relative to $V_{LLP}$). Two separated, mostly parallel bands 400, 410 will be seen extending from the upper left to the lower right. These are narrow regions where the gradient was highest, signifying transitions in the charge state. (That is, the current shows a sharp rise where the gate voltage passes a threshold for inducing a detectable change in the electronic occupancy of the quantum dots.) Accordingly, it will be seen that the total electronic occupancy of the DQD is 1 at the bottom of the figure, 2 in the middle, and 3 at the top of the figure.

The charge-preserving lines 420, 430 are also shown on FIG. 4A. They are seen as the parallel dashed lines extending from the upper left to the lower right at a steeper inclination than the parallel bands referred to above. The triplet line 420 is on the left, and the singlet line 430 is on the right.

In the geometrical configuration of the quantum dots that we adopted in our experiments, the dipole field of the DQD as experienced by the charge sensor does not change substantially when an electron tunnels from one dot of the DQD to the other without changing the total confined charge. As a consequence, we would not expect to observe a change in charge sensor current for charge transitions at the charge-preserving lines.

One consequence, as will be explained below, is that we use detection of changes in the total electronic occupancy as an indirect route to measuring changes in the two-electron spin state. It should be noted, however, that the detection method described here is offered merely for purposes of illustration. It is only one example among numerous detection methods that are known in the art, and thus should be understood only as a non-limiting example.

Figure 4B:
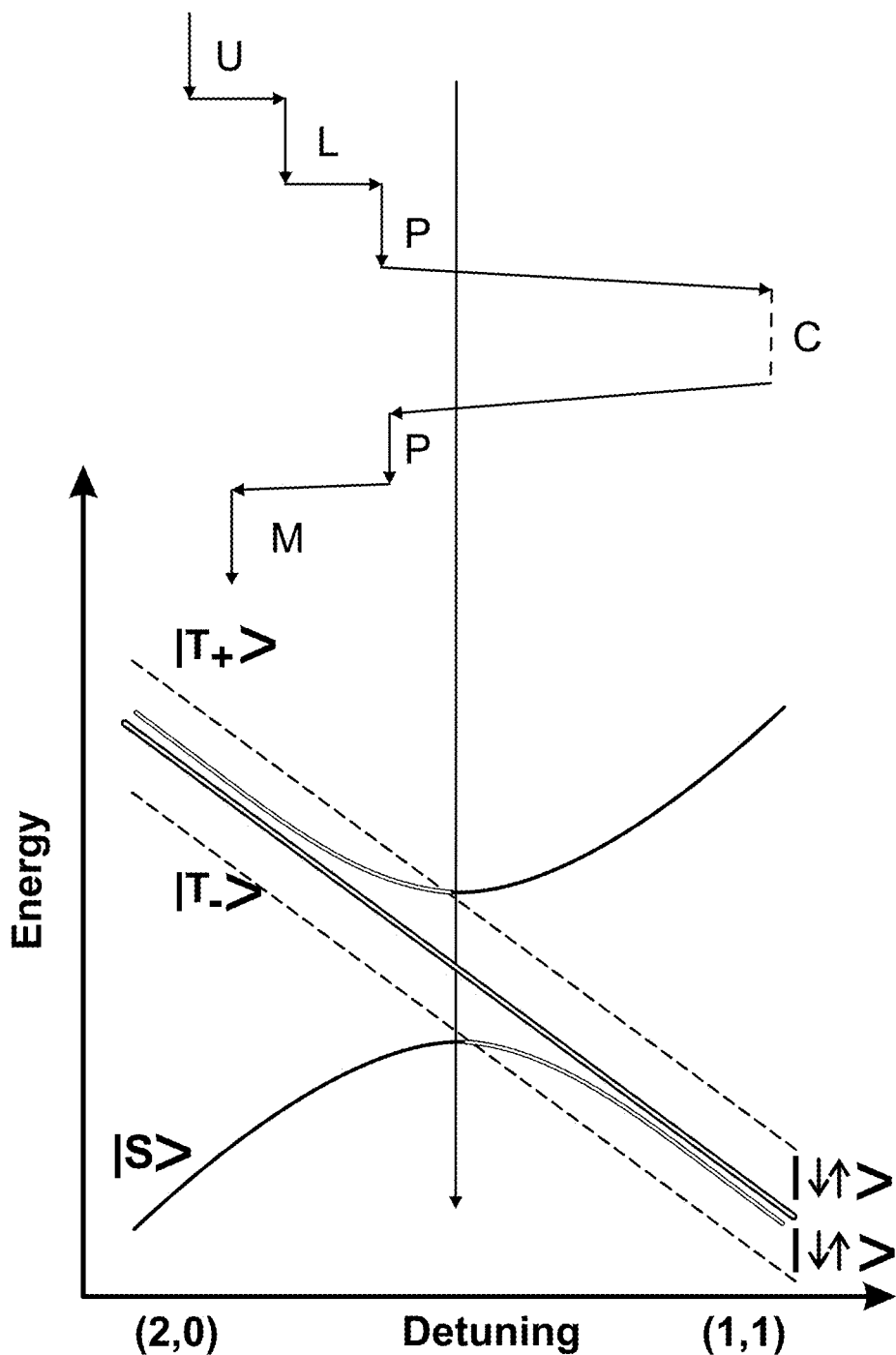
FIG. 4B provides a schematic energy level diagram for the DQD of FIG. 4A. Also provided in FIG. 4B is a pulse profile for controlling the relative quantum dot detuning and thereby producing charge-state transitions that are indicated on FIG. 4A.

The arrows superposed on FIG. 4A represent a general pulse sequence for controlling the qubit. The corresponding pulse profile is shown at the top of FIG. 4B, where each pulse is positioned above the place on the detuning axis to which it brings the state of the DQD. Qubit manipulations are performed at point C. In FIG. 4A, a dashed line at point C signifies that a plurality of detuning pulses, corresponding to any one of various qubit manipulation sequences, may be applied before exiting point C.

According to the process illustrated in FIGS. 4A and 4B, the qubit is initialized into the S(2, 0) ground state. Then a rapid adiabatic pulse transfers the qubit to the (1, 1) charge sector while maintaining the singlet spin state. The difference in Zeeman splittings between the respective QDs drives X-rotations between the S(1, 1) and $T_0$(1, 1) states. A rapid adiabatic return pulse projects the qubit states onto the S(2, 0) and $T_0$(1, 1) basis for measurement.

The pulse sequence shown in the figures is repeated cyclically while the current through the SET is monitored.

The system is initialized in the (2,0) charge sector by unloading (point U) the DQD into the (1,0) charge configuration and then applying an energy-selective pulse into the (2,0) charge state between the singlet and triplet energy levels such that an S(2,0) ground state is loaded (point L). The system is then plunged (point P) to a detuning ($\varepsilon$<0) close to the charge anticrossing. The electrons are then separated (point C), and qubit manipulations are performed in the (1,1) charge region ($\varepsilon$>0).

The system is then pulsed back to the (2,0) charge sector (point P). At point P, a singlet spin state is permitted to transfer to the (2,0) charge state, but due to Pauli spin blockade, a triplet spin state is energetically blocked and remains as a (1,1) charge state.

We then pulse to point M, where the read-out is performed by spin-to-charge conversion. We use an enhanced latching mechanism for spin-to-charge conversion. The DQD state is read out as follows: If it is a triplet, it is mapped to a (2,1) charge state; if it is a singlet, it is read out as (2,0).

More specifically, the triplet (1, 1) state can transfer relatively quickly to the (2, 1) charge state by inelastic tunneling of an electron into $QD_1$ from the LRG charge reservoir. The resulting change in the total charge on the DQD is detected by the SET. On the other hand, the singlet remains locked in a metastable (2, 0) charge state at point M, because the path for relaxation to a (2, 1) charge state is only through a slow co-tunneling process.

One important conclusion from our work is that the spin-orbit effect is useful not only for producing state rotations in two-electron qubits, but also in single-electron spin qubits. That is, a single quantum dot of the kind described here is populated with an electron, and an applied magnetic field having a component parallel to the interface induces cyclotron motion of the electron near the interface. FIG. 5 shows an example, in schematic cross-sectional view, of a substrate 500 overlain by an oxide layer 510 and an electrode 520. The cyclotron orbit 530 is shown of a single electron in externally applied magnetic field 540.

As explained above, the resulting electronic momentum component parallel to the interface makes the electron susceptible to interfacial spin-orbit effects. In particular, these effects are manifested as an effective magnetic field that affects Larmor precession of the electronic spin state. The spin state of the electron can be collapsed to one of the two possible observable states and read out by techniques that are well known in the art.

The tuning mechanism described above can be used to control the Larmor frequency. That is, the gate voltages control the depth of interaction of the electronic wavefunction with the electric fields due to the interfacial phenomena. Consequently, a desired Larmor frequency can be selected by selecting suitable gate voltages, and electron spin state rotations can be produced by applying suitably tailored voltage pulse sequences to the gate electrodes.

More specifically, an external magnetic field applied parallel to the interface (e.g., along the [100] crystallographic direction) causes a Zeeman splitting of the spin states, and in addition, it invokes a non-zero momentum component of the electron at the interface. The interfacial momentum component causes Rashba and Dresselhaus contributions to an interfacial spin-orbit effect, resulting in effective Rashba and Dresselhaus magnetic fields.

The Rashba field (in the case of an external magnetic field applied along the [100] crystallographic direction) will be parallel (or anti-parallel) to the external magnetic field and will add to (or decrease, if anti-parallel) the spin splitting.

The Dresselhaus field (in the case of the external magnetic field being along the [100] crystallographic direction) will be perpendicular to the external magnetic field and therefore will not affect the spin splitting.

A voltage with alternating current (AC) modulation is applied to the QD confinement gate, thereby producing an oscillating vertical electric field. The oscillating vertical field causes the spin-orbit strength to oscillate, and it also causes an effective AC magnetic field (due to the Dresselhaus SO contribution) directed perpendicular to the spin quantization axis (i.e., perpendicular to the external magnetic field direction).

When the AC magnetic field is on resonance with the Larmor frequency, it will drive rotations of the electronic spin state.

Z-Rotations.

The second axis of coherent control for ST qubits is achieved through the tunable exchange coupling of the (1, 1) and (2, 0) charge states. This leads to hybridization between the (2, 0) and (1, 1) charge states and an exchange splitting, J($\varepsilon$), between the S and $T_0$ qubit states that depends on the detuning $\varepsilon$. By varying the strength of this interaction, we can achieve controlled coherent rotations.

Figure 6:
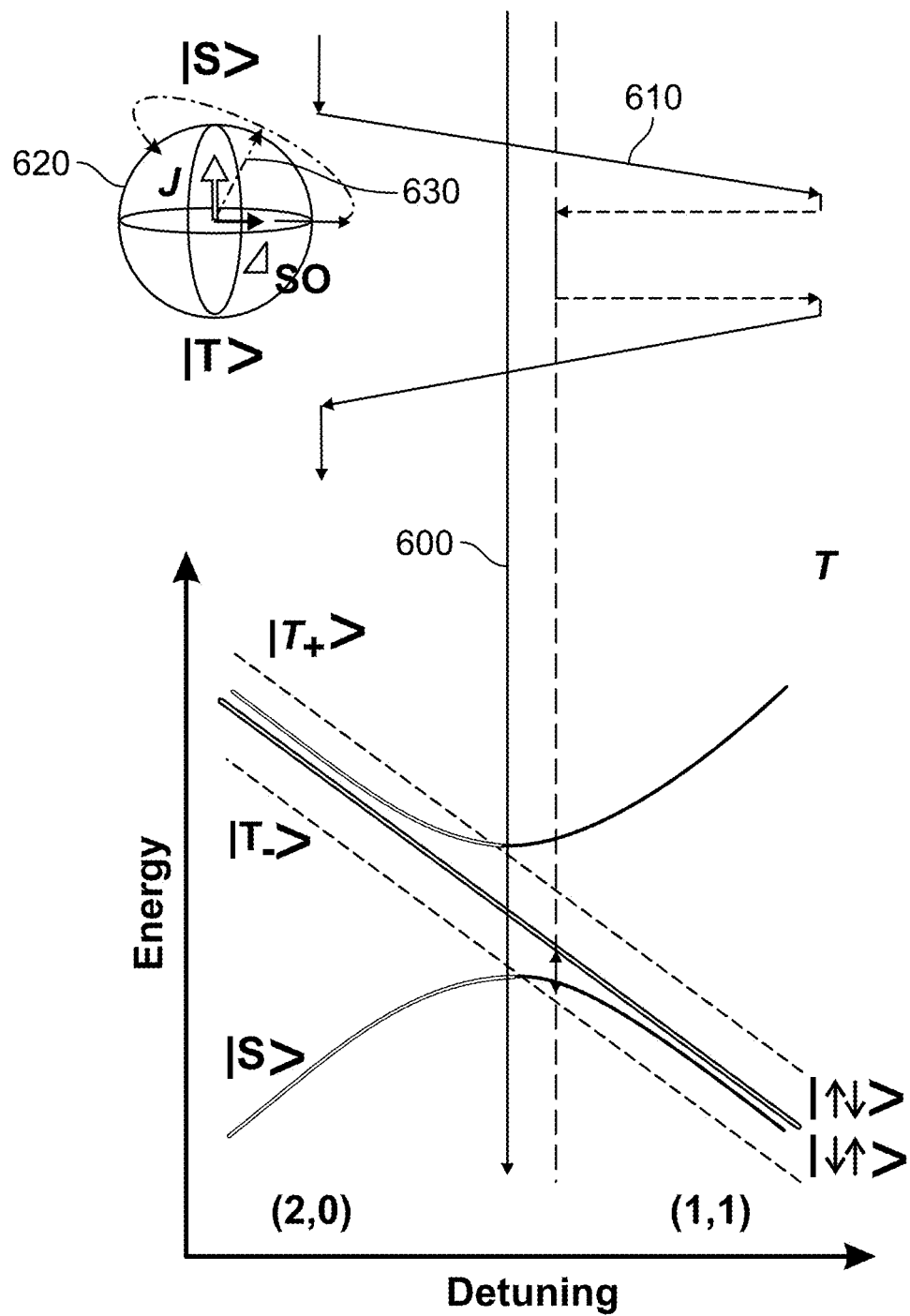
FIG. 6 provides a schematic energy level diagram showing the respective singlet and triplet energy levels as functions of detuning near the (2,0)→(1,1) anticrossing. The upper portion of the figure shows an example pulse profile for producing Z-rotations. Each pulse is placed above the position on the detuning scale that it is meant to produce. An inset in the upper portion of the figure shows the Bloch sphere. Rotation about a tilted axis is indicated in the inset.

FIG. 6 again shows the respective energy levels as a function of detuning near the anticrossing 600. The upper portion of the figure shows an example pulse profile 610 for producing Z-rotations. Each pulse is placed above the position on the detuning scale that it is meant to produce. An inset in the upper portion of the figure shows the Bloch sphere 620. Rotation about a tilted axis 630 is indicated in the inset. This signifies that the rotation has two components: One due to the exchange energy and one due to the SO interaction.

The DQD is initialized into a S(2, 0) ground state. We then adiabatically separate the electrons into the (1, 1) charge configuration where J($\varepsilon$) is nearly zero and the qubit is initialized in the ground state of the SO field ($|\uparrow\downarrow\rangle$ or $|\downarrow\uparrow\rangle$), which is a superposition of the S(1, 1) and $T_0$(1, 1) states.

We apply a fast pulse to a finite J($\varepsilon$) at $\varepsilon$ near 0 for some waiting time, and then we apply a fast return pulse. The finite J($\varepsilon$) rotates the qubit state around the Bloch sphere about a rotation axis that depends both on J and on $\Delta$SO, i.e., on the SO-induced splitting of the $|\uparrow\downarrow\rangle$ and $|\downarrow\uparrow\rangle$ states.

In an example, we applied a field of 0.2 T along the [100] direction, which provided a small (0.5 MHz) residual X-rotation frequency. At detuning near $\varepsilon$=0, we observed an increased rotation frequency. As the exchange pulse moved to deeper detuning, we observed a decrease in rotation frequency as well as a decrease in visibility. This was expected, because with deeper detuning, J tends to decrease and the rotation axis tends to tilt toward the direction of the SO field difference.

Figure 7:
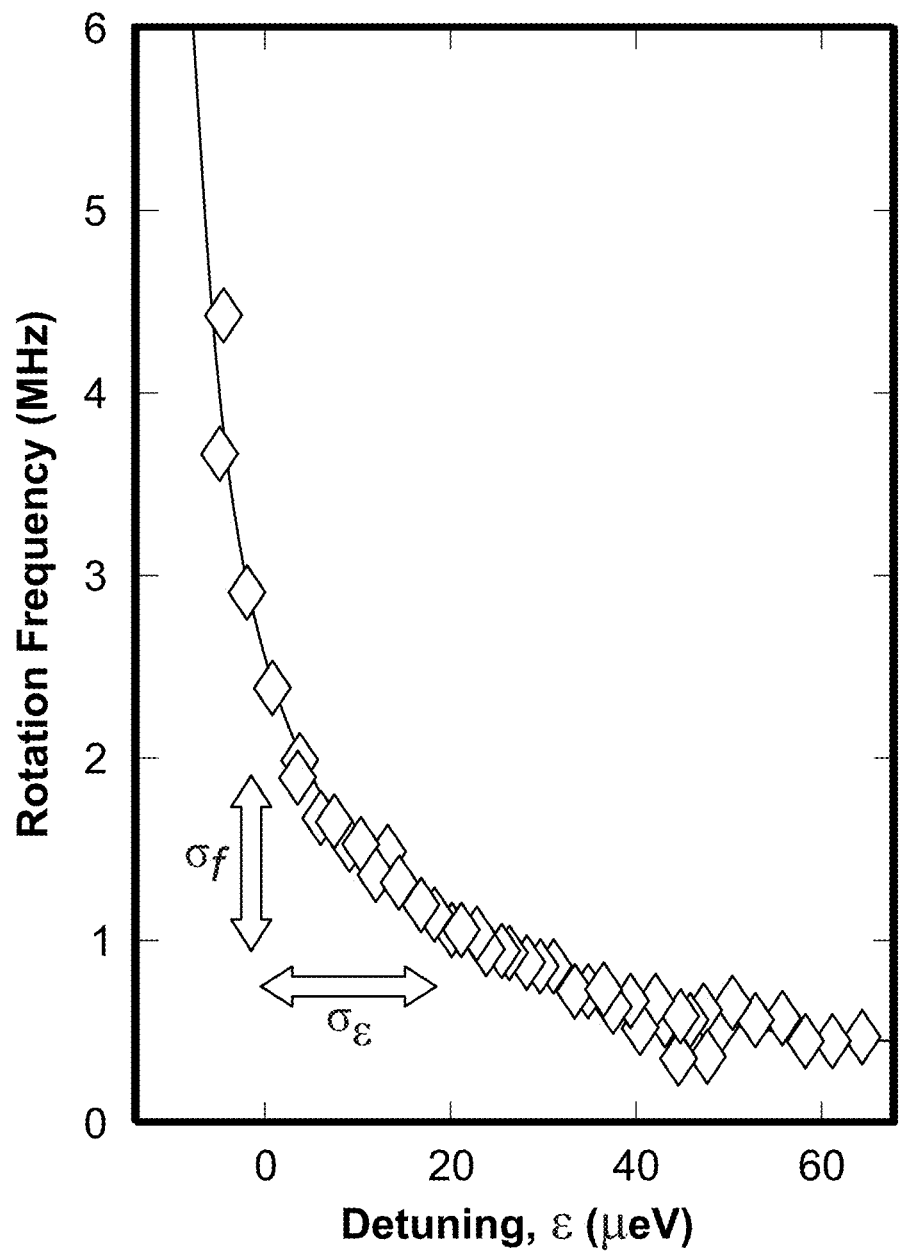
FIG. 7 is a graph of observed rotation frequency versus detuning for rotation about an axis that combines X-rotation with Z-rotation.

FIG. 7 shows the observed rotation frequency (in MHz) as a function of detuning (in micro-electron volts.) The rotation frequency can be expressed as $$\nu_{e,rad} \sqrt{J(\varepsilon)^2 + \Delta_{SO}^2},$$

since the respective components add in quadrature. Indeed, our measurements show that at deep detuning the rotation frequency saturated near 0.5 MHz due to the SO field at the applied magnetic field strength and orientation.

EXAMPLE

We fabricated a singlet-triplet (ST) qubit in a fully foundry-compatible process using a single-gate-layer, metal-oxide-semiconductor (MOS) polysilicon gate stack with an epitaxially-enriched $^{28}$Si epilayer.

The material stack consisted of 200 nm highly arsenic-doped ($5 \times 10^{15}$ cm$^{-2}$ at 50 keV) polysilicon and 35 nm of silicon oxide on top of a silicon substrate with an isotopically enriched epitaxial layer hosting 500 ppm residual $^{29}$Si. Ohmic implants were formed using optical lithography and implantation of arsenic at $3 \times 10^{15}$ cm$^{-2}$ at 100 keV. The confinement and depletion gates were defined by electron beam lithography followed by selective dry etching of the polysilicon.

Hall bars from the same sample wafer with the same gate oxide were used to extract the critical density ($n_c = 5.7 \times 10^{11}$ cm$^{-2}$), the peak mobility ($\mu = 4500$ cm$^2$ V$^{-1}$ s$^{-1}$), threshold voltage ($V_{th} = 1.1$ V), the RMS interface roughness ($\Delta = 2.4$ Å), and roughness correlation length ($\lambda = 26$ Å).

FIGS. 2A and 2B, discussed above, were based on a scanning electron microscope image of a device fabricated to be nominally identically to the device used for the measurements reported here. FIG. 2B also provides a schematic of the gate stack.

The device was operated in an enhancement mode using voltage biasing of the highly doped n+ polysilicon gates to confine electrons to quantum dot (QD) potentials under gates LCP and UCP. The gates ULG, URG, LLG and LRG, which overlapped n+ regions and ohmic contacts, were biased to accumulate a two-dimensional electron gas (2 DEG) under each gate. The 2 DEGs act as source and drain electron reservoirs for the quantum dots.

The lower half of the device was tuned such that a double quantum dot (DQD) was formed. The quantum dot denominated $QD_1$ was tunnel coupled to the reservoir under LRG. The other quantum dot, designated $QD_2$, was positioned such that it could occupied only by tunneling of electrons through $QD_1$.

$QD_1$ was defined by the gate geometry. $QD_2$ was formed incidentally, but it survived thermal cycling and was thus a built-in feature of the device.

Figure 8:
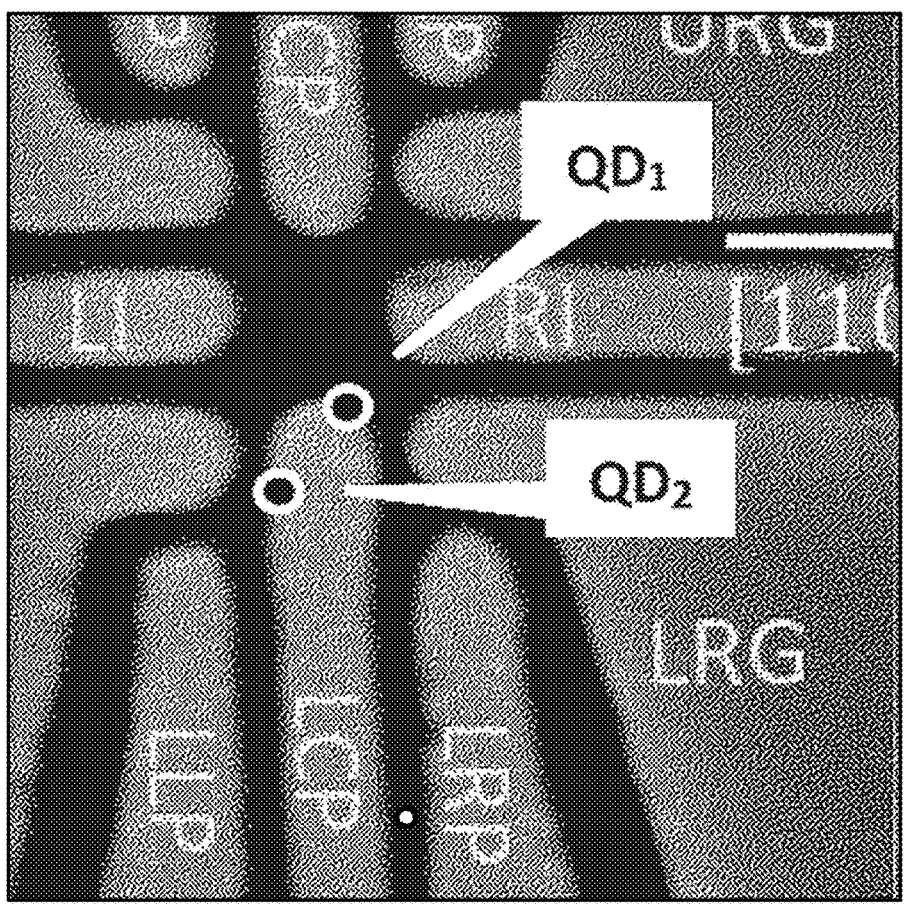
FIG. 8 is a detail of FIG. 2A on which the relative positions of various quantum dots and gate electrodes are indicated.

FIG. 8 is a detail of FIG. 2A on which the relative positions of QD1, QD2, and gate LRG are indicated.

One quantum dot in the upper half of the device was used as a single electron transistor (SET) remote charge sensor for spin-to-charge conversion. The SET was biased with 70 μV (rms) AC bias at 0V DC and the current was measured with an AC lock-in technique at 979 Hz. The electron temperature, $T_e$, of about 150 mK was measured by QD charge transition line width.

More details about the fabrication process can be found in S. Rochette et al., "Single-electron-occupation metal-oxide-semiconductor quantum dots formed from efficient polysilicon gate layout," Preprint at http://arxiv.org/abs/1707.03895 (2017), the entirety of which is hereby incorporated herein by reference.

Measurements were performed in a 3 He/4 He dilution refrigerator with a base temperature of around 8 mK. The effective electron temperature in the device was 150 mK as measured by QD charge transition line width. Fast RF lines were connected to cryogenic RC bias tees on the sample board, which allowed for the application of fast gate pulses. An external magnetic field was applied using a 3-axis vector magnet.

The number of electrons in each QD was inferred from changes in the current through the SET as the voltages on gate LLP and gate LCP were varied. A contour plot of the SET current gradient over the two-dimensional space defined by the respective gate voltages exhibited charge-stability regions separated by boundaries where the current gradient was high. Each of these boundaries indicated a transition in the charge state. This technique for inferring QD occupation numbers is known in the art and need not be described here in further detail.

We used capacitance measurements to determine the locations of $QD_1$ and $QD_2$. By scanning combinations of the polysilicon gates, we were able to obtain the relative capacitance of each quantum dot to each gate, relative to the capacitance of gate LCP. (Gate LCP had the strongest capacitive coupling to both QDs.) From these values, we could triangulate the dot locations. This technique is known in the art and need not be described here in further detail.

Figure 9:
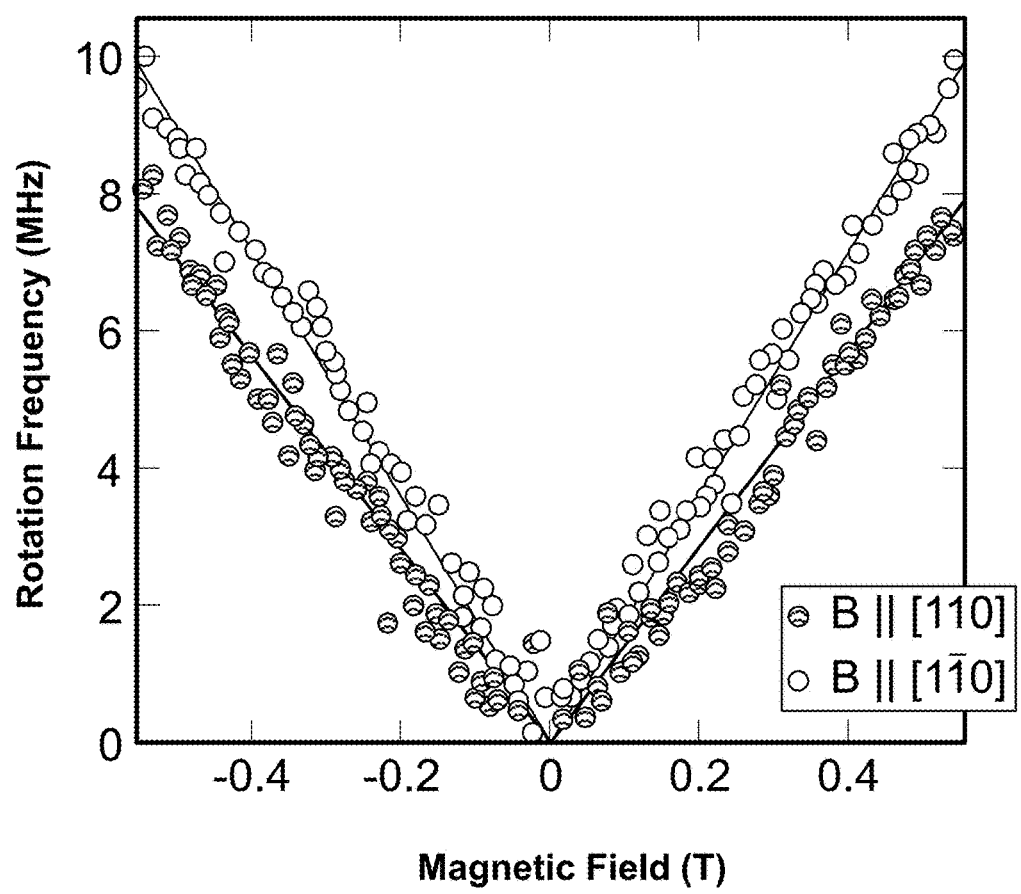
FIG. 9 is a graph of X-rotation frequency as a function of magnetic field strength along the [110] (bottom curve) and [1$\bar{1}$0] (top curve) crystallographic directions.

FIG. 9 is a graph of X-rotation frequency (extracted from the experimental data) as a function of magnetic field strength along the [110] (bottom curve) and [1$\bar{1}$0] (top curve) crystallographic directions.

FIG. 7, discussed above, is a graph of observed rotation frequency versus detuning for rotation about an axis that combines X-rotation with Z-rotation.

Figure 10:
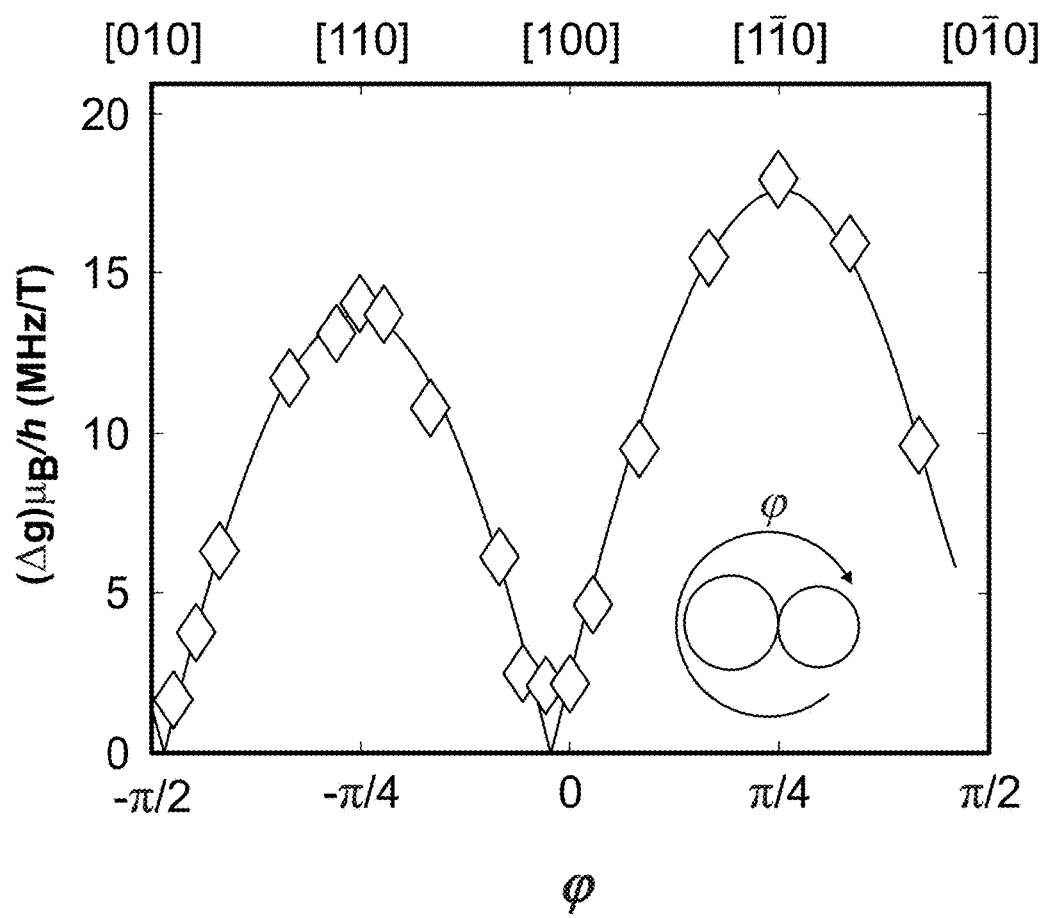
FIGS. 10 and 11 are plots of Δg as a function of the magnetic field direction, where Δg is the difference in g-factor between the quantum dots.
Figure 11:
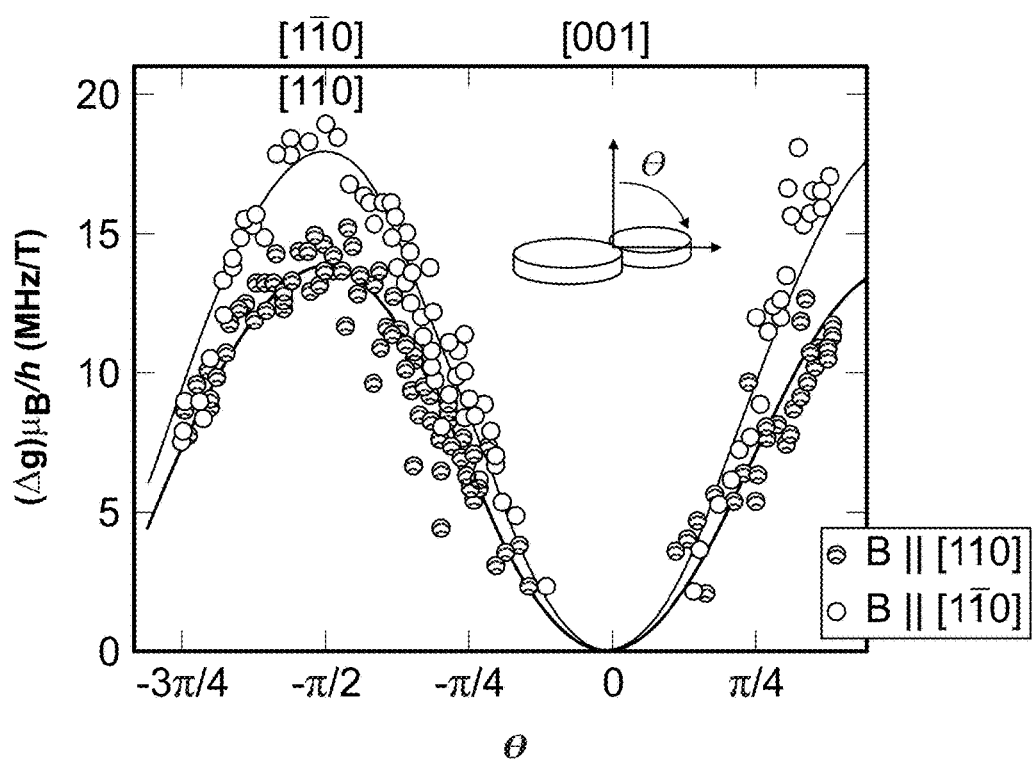

FIGS. 10 and 11 are plots of Δg as a function of the magnetic field direction, where Δg is the difference in g-factor between the dots. In FIG. 10, the quantity $\Delta g \cdot \mu_B/h$ is plotted against the in-plane angular coordinate φ. In FIG. 11, the same quantity is plotted against the out-of-plane angular coordinate θ. Two sets of data are plotted in FIG. 11. The lower set is for a magnetic field applied along the [110] crystallographic direction, and the upper set is for the [1$\bar{1}$0] direction. The solid curves in the figures are fits to the form $$\frac{(\Delta g)\mu_B}{h} = |B||\Delta\alpha - \Delta\beta\sin(2\varphi)|\sin^2(\theta),$$

where $\theta = \pi/2$ in FIG. 10, $\varphi = 3\pi/4$ in the lower curve of FIG. 11, and $\varphi = \pi/4$ in the upper curve of FIG. 11.

Figure 12:
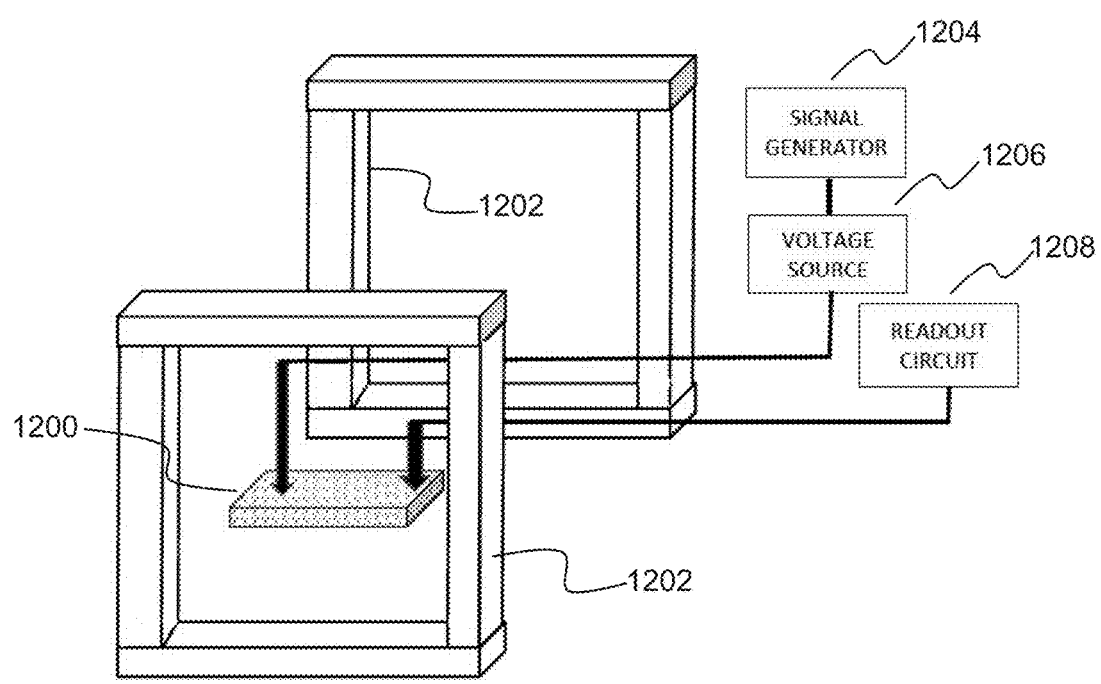
FIG. 12 is a notional block diagram of a system in which the DQD device can be subjected to a magnetic field from a magnetic field source.

FIG. 12 is a notional block diagram of a system in which the DQD device 1200 can be subjected to a magnetic field from magnetic field source 1202. Also included in the system, as shown, are signal generator 1204, voltage source 1206, and readout circuit 1208.

We claim:
1. A method of quantum information processing using a lateral double quantum dot (DQD) disposed at a substrate surface and having a first quantum dot ($QD_1$) tunnel-coupled to a second quantum dot ($QD_2$), comprising:
  populating $QD_1$ with two confined electrons;
  transferring one confined electron to $QD_2$ to create a (1, 1) charge state;
  performing at least two state rotations on the confined electrons while the DQD is in the (1, 1) charge state; and
  reading out a final quantum state of the DQD, wherein:
the at least two state rotations are performed while exposing the DQD to an externally sourced magnetic field having a component directed parallel to the substrate surface;
the performing of each of the at least two state rotations consists of applying a voltage pulse sequence to a planar gate electrode or combination of planar gate electrodes that is electrostatically coupled to the confined electrons so as to vary a relative tuning between $QD_1$ and $QD_2$;
at least a first one of the voltage pulse sequences comprises maintaining, for a first specified duration, a first relative tuning between $QD_1$ and $QD_2$; and
at least a second one of the voltage pulse sequences comprises maintaining, for a second specified duration, a second relative tuning between $QD_1$ and $QD_2$ that is different from the first relative tuning.

2. The method of claim 1, wherein $QD_1$ and $QD_2$ are laterally disposed relative to each other.

3. The method of claim 1, wherein the populating, transferring, state-rotation-performing, and readout steps are cyclically repeated multiple times.

4. The method of claim 1, further comprising forming $QD_1$ and $QD_2$ by applying voltages to planar gate electrodes that overlie the substrate surface.

5. The method of claim 1, wherein the substrate surface is a surface of a silicon body, and wherein the surface of the silicon body is directly overlain by a layer of silicon oxide.

6. The method of claim 1, wherein the state-rotating voltage-pulse sequences are applied to a single layer of polysilicon planar gate electrodes that overlie the layer of silicon oxide.

7. The method of claim 1, wherein the at least two state rotations comprise:
at least one state rotation that, at least in part, is a rotation between singlet and triplet states of the DQD; and
at least one state rotation that, at least in part, is a rotation between $|\uparrow\downarrow\rangle$ and $|\downarrow\uparrow\rangle$ states of the DQD.

8. A method of quantum information processing using a single-electron spin qubit embodied in a quantum dot (QD) disposed at a silicon substrate surface overlain by a layer of silicon oxide, comprising:
populating the QD with a confined electron having two spin states relative to a quantization axis;
performing at least one state rotation on the confined electron; and
reading out a final quantum state of the QD,
wherein:
the at least one state rotation is performed while exposing the QD to an externally sourced magnetic field having a component directed parallel to the substrate surface;
the QD has a tuning state that moves up and down in energy in response to a voltage applied to a controlling gate electrode arrangement;
the performing of the at least one state rotation consists of applying a voltage pulse sequence to the controlling gate electrode arrangement; and
the voltage pulse sequence is effective to invoke an effective magnetic field perpendicular to the quantization axis of the spin state of the QD electron and to induce spin state rotations.

* * * * *